United States Patent
Buckwalter et al.

(10) Patent No.: US 7,463,680 B2
(45) Date of Patent: Dec. 9, 2008

(54) DETERMINISTIC JITTER EQUALIZER

(75) Inventors: James Buckwalter, Pasadena, CA (US);
Seyed Ali Hajimiri, Pasadena, CA (US);
Behnam Analui, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 736 days.

(21) Appl. No.: 11/012,857

(22) Filed: Dec. 14, 2004

(65) Prior Publication Data

US 2005/0152488 A1 Jul. 14, 2005

Related U.S. Application Data

(60) Provisional application No. 60/529,871, filed on Dec. 16, 2003.

(51) Int. Cl.
*H03H 7/30* (2006.01)

(52) U.S. Cl. ...................................................... 375/233

(58) Field of Classification Search ................. 375/232, 375/233, 355
See application file for complete search history.

(56) References Cited

U.S. PATENT DOCUMENTS 5,345,476 A * 9/1994 Tsujimoto ................... 375/233
2005/0053162 A1 * 3/2005 Goishi ......................... 375/259

FOREIGN PATENT DOCUMENTS

WO   WO 03/045003   *  5/2003

OTHER PUBLICATIONS

R. Kollipara, et al. "Design, Modeling and Characterizaiton of High Speed Backplane Interconnects", *DesignCon2003* (2003).
R. Ho, et al. "The Future of Wires", *Proc. of the IEEE* (2001) 89(4):490-504.
J. Zerbe, et al. "Equalization and Clock Recovery for a 2.5 -10Gbs 2-PAM/4-PAM Backplane Transceiver Cell", *ISSCC Digest* (2003) 80-81.
V. Stojanovic, et al. "Modeling and Analysis of High-Speed Links", *CICC 2003* (2003) 589-594.
H. Nyquist, "Certain Topics in Telegraph Transmission Theory", *AIEE Trans*, (1928) 47:617-644.

(Continued)

*Primary Examiner*—Kevin Y Kim
(74) *Attorney, Agent, or Firm*—Townsend and Townsend and Crew

(57) ABSTRACT

An equalizer for serial data communications can be configured to compensate for the effects of deterministic jitter. The equalizer can be configured to compensate a received serial data stream for the effects of data-dependent jitter as well as duty cycle distortion jitter. The equalizer can be configured to determine the value of one or more previously received symbols and compare them to a recovered symbol. The equalizer can adjust a variable delay positioned in the serial data path to introduce a delay into the data path that is based in part on the received data stream. The equalizer can be configured to vary the delay when any of the one or more previously received symbols is different from the recovered symbol, and can be configured to maintain a constant delay if the one or more previously received symbols is the same as the recovered symbol.

25 Claims, 18 Drawing Sheets

OTHER PUBLICATIONS

Y. Cai, et al. "Jitter Testing for Multi-Gigabit Backplane SerDes-Techniques to Decompose and Combine Various Types of Jitter", *Proc. of IEEE International Test Conference* (2002) 700-709.

M. Shimanouchi, et al. "An Approach to Consistent Jitter Modeling for Various Aspects and Measurement Methods", *Proc. of IEEE International Test Conference* (2001) 848-857.

L. Moura, et al. "Performance Assessment of Signal Jitter on Clock Recovery for High Speed Optical Digital Systems", *IEEE Global Communications Conference* (1994) 2:1175-1179.

C.J. Byrne, et al. "Systematic Jitter in a Chain of Digital Regenerators", *The Bell System Technical Journal* (1963) 42(6):2679-2714.

B.R. Saltzberg, "Timing Recovery for Synchronous Binary Data Transmission", *The Bell System Technical Journal* (1967) 46(3):593-622.

R.D. Gitlin, et al. "Timing Recovery in PAM Systems", *The Bell System Technical Journal* (1971) 50(5):1645-1669.

L.E. Franks, et al. "Statistical Properties of Timing Jitter in a PAM Timing Recovery Scheme", *IEEE Trans. on Communications* (1974) 22(7):913-920.

J.J. O'Reilly, et al. "Influence of Timing Errors on the Performance of Direct-Detection Optical-Fibre Communication Systems", *IEE Proc.* (1985) 132(6):309-313.

M.Z. Win, "On the Power Spectral Density of Digital Pulse Streams Generated by *M*-ary Cyclostationary Sequences in the Presence of Stationary Timing Jitter", *IEEE Trans. on Communications* (1998) 46(9):1135-1145.

R.A. Gibby, et al. "Some Extensions of Nyquist's Telegraph Theory", *The Bell System Technical Journal* (1965) 44(9):1487-1510.

M. Banu, et al. "A 660Mb/s CMOS Clock Recovery Circuit with Instantaneous Locking for NRZ Data and Burst-Mode Transmission", *ISSCC Dig. Tech Papers* (1993) 102-103, 270.

V.F. Kroupa, "Noise Properties of PLL Systems", *IEEE Trans. on Communications* (1982) 30(10):2244-2252.

E. Roza, "Analysis of Phase-Locked Timing Extraction Circuits for Pulse Code Transmission", *IEEE Trans. on Communications* (1974) 22(9):1236-1249.

K. Kishine, et al. "Loop-Parameter Optimization of a PLL for Low-Jitter 2.5 Gb/s One-Chip Optical Receiver IC with 1:8 Demux", *IEEE J. of Solid-State Circuits* (2002) 37(1):38-50.

M. Mansuri, et al. "Jitter Optimization Based on Phase-Locked Loop Design Parameters", *IEEE J. of Solid-State Circuits* (2002) 37(11) 1375-1382.

\* cited by examiner

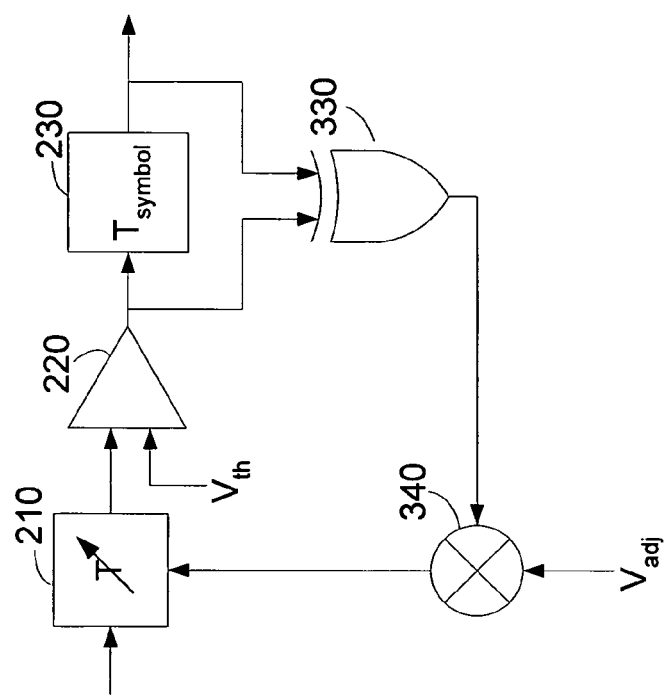
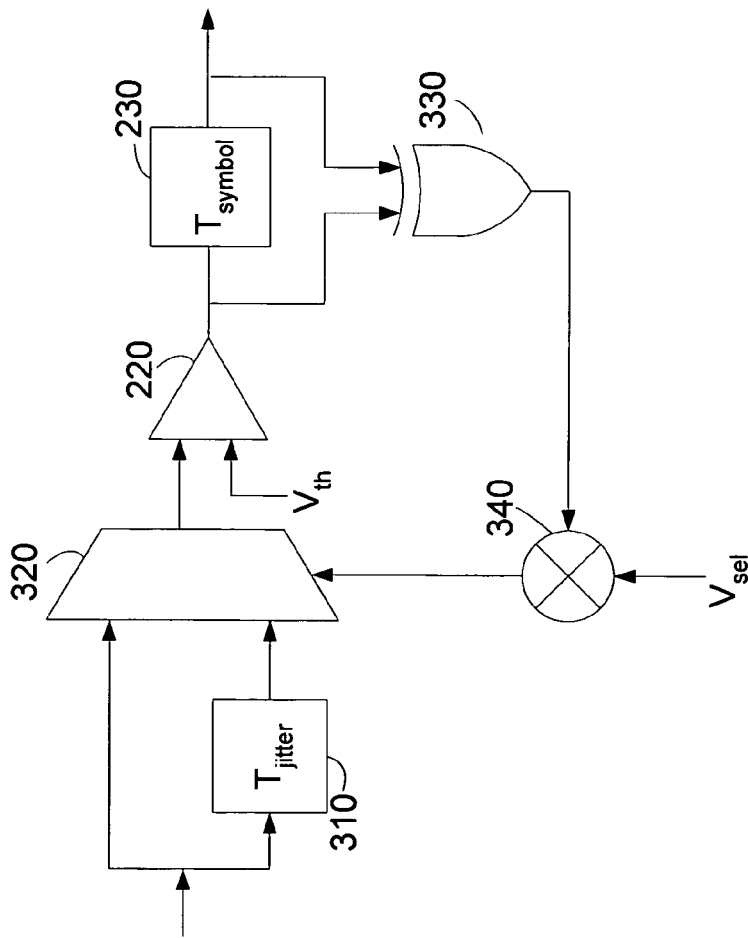
FIG. 3B
FIG. 3A

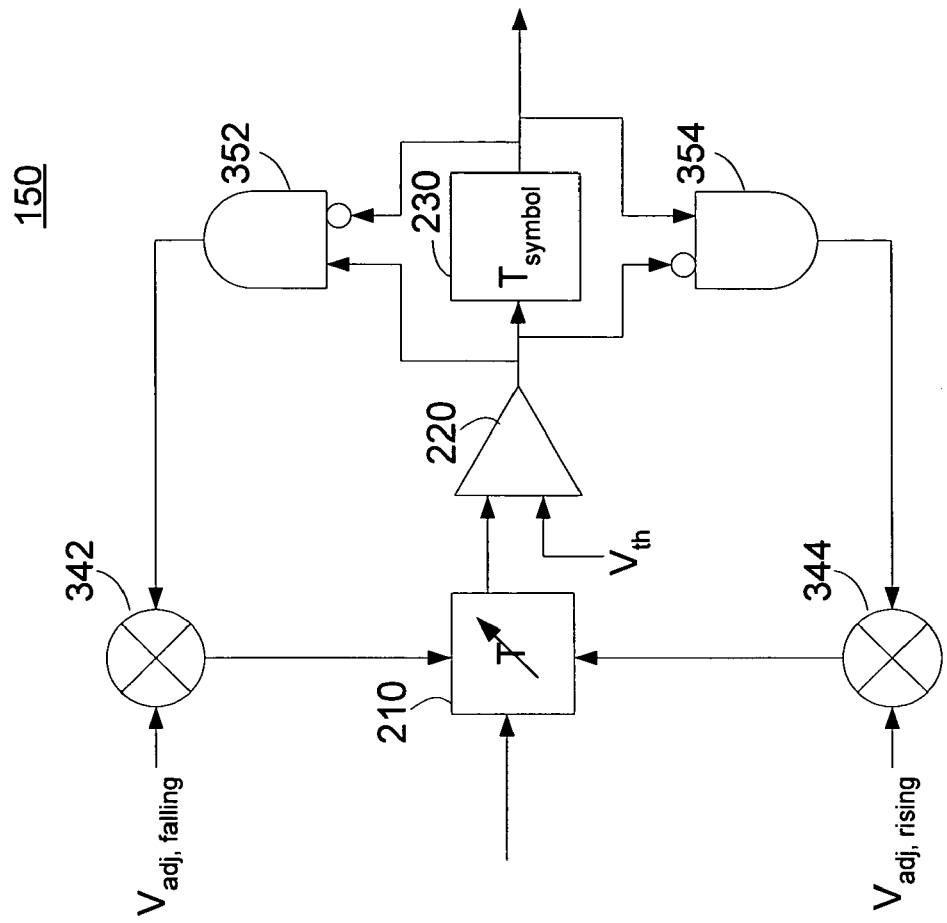
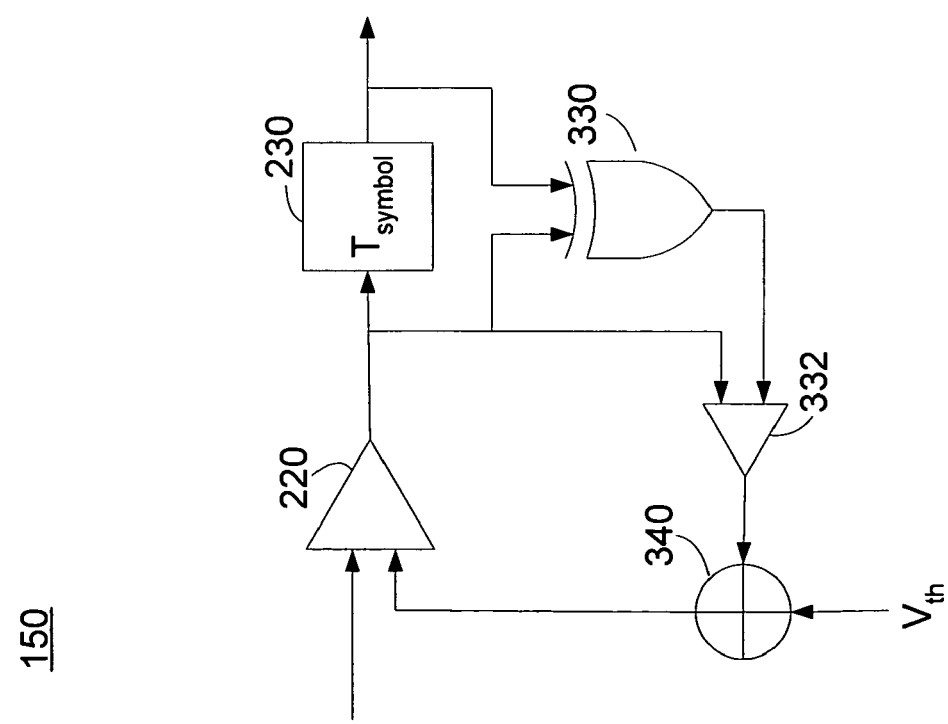
FIG. 3D
FIG. 3C

DETERMINISTIC JITTER EQUALIZER

CROSS-REFERENCES TO RELATED APPLICATIONS

This application claims the benefit of U.S. Provisional Application No. 60/529,871, filed Dec. 16, 2003, entitled DETERMINISTIC JITTER EQUALIZER; which is hereby incorporated herein by reference in its entirety.

STATEMENT AS TO RIGHTS TO INVENTIONS MADE UNDER FEDERALLY SPONSORED RESEARCH OR DEVELOPMENT

This invention was made with government support under ECS-0239343 awarded by The National Science Foundation. The government has certain rights in the invention.

BACKGROUND OF THE DISCLOSURE

The present invention relates to electronic data communications. More particularly, the disclosure relates to timing jitter and compensating for timing jitter in a high speed communication link.

Signal integrity issues such as timing jitter are at the forefront of high-speed digital design for communication applications. Electronic circuit speeds are overwhelming the legacy channels that traditionally could be treated as ideal. In high-speed data circuits, the channel behavior is typically compensated appropriately to enable the highest information capacity. Noise considerations dictate the choice of equalization technique.

In serial communications, data encoded as symbols are transmitted over a channel such as optical fiber or copper backplane. Physical characteristics of the channel can dictate an optimal modulation scheme and appropriate symbols. To utilize the channel efficiently, the highest symbol rate is desired. However, if the symbol rate exceeds the bandwidth of any component in the communication link, errors often occur during the data transmission. Insufficient bandwidth does not allow the signal to make a complete transition within a symbol period and the margin between symbol levels is reduced. This well-known penalty is intersymbol interference (ISI). Furthermore, insufficient bandwidth causes the symbol timing at the receiver to deviate from the timing at the transmitter. The total deviation, called timing jitter, is exacerbated in high-speed communication systems and jitter requirements are increasingly restrictive.

Jitter is deviations in the timing of received data bits compared to a reference, such as a data stream in the transmitter. The quality of a received data stream can be analyzed by examining a data eye that is generated by overlaying the received data stream over a time period sufficient to allow all possible data states and state transitions to occur. Data jitter reduces the horizontal opening of the data eye.

Timing jitter is composed of random and deterministic terms that quantify the total jitter. Random jitter is typically a Gaussian distribution with variance related to the transition characteristic of the system. Two forms of deterministic jitter (DJ) are data-dependent jitter and duty-cycle distortion. Data-dependent jitter (DDJ) refers to the impact of the previous symbols on the current timing deviation. Common sources of DDJ include finite system bandwidth and signal reflection. Duty-cycle distortion (DCD) results from the asymmetric response characterized with different rise and fall times of data signal transitions. DDJ and DCD tend to dominate in serial links.

A simple communication link introduces several sources of jitter. Generally, all components within a link are typically designed to meet a jitter budget since the jitter accumulates. Jitter generated in the transmitter increases through any regenerating stage in the link. Furthermore, the signal is attenuated during transmission over the channel, reducing the signal-to-noise ratio and limiting the sensitivity of the receiver. The receiver has amplification stages with a given bandwidth to limit the noise. The timing jitter is often most severe after this amplification at the input to the clock and data recovery (CDR) circuit.

In high-speed data circuits the sampling clock is typically recovered from the edges of received data to eliminate the need to separately communicate a clock signal. Therefore, the data jitter deviations translate to phase noise in the recovered clock and consequently sampling uncertainty in the data eye. This uncertainty reduces the receiver bit error rate (BER) performance.

BER requirements compel limiting the jitter from the standpoint of decision errors and the performance of the CDR circuit. Additionally, managing jitter can loosen the restrictions on the jitter transfer and, hence, the bandwidth of the clock recovery, reducing acquisition time of the CDR circuit.

The symbol is typically detected in the CDR circuit. The data recovery circuit samples the corrupted data in the time domain with a local oscillator. Horizontal eye closure due to DJ reduces the range of times that accurately sample the data. Additionally, the local oscillator is synchronized to the data transitions. Therefore, timing jitter of the data disturbs the oscillator and the sampling uncertainty is increased. Accordingly, DJ has time and frequency domain interpretations.

From the above, it is seen that techniques for improving data communications are highly desired.

BRIEF SUMMARY OF THE DISCLOSURE

An equalizer for serial data communications can be configured to compensate for the effects of deterministic jitter. The equalizer can be configured to compensate a received serial data stream for the effects of data-dependent jitter as well as duty cycle distortion jitter. The equalizer can be configured to determine the value of one or more previously received symbols and determine whether one or more state transitions occurred. The equalizer can then be configured to adjust a timing of a symbol of interest. The equalizer can adjust a variable delay or threshold voltage positioned in the serial data path to introduce a delay into the data path that is based in part on the received data stream. The equalizer can be configured to vary the delay by a specific amount depending on the sequence of previously received symbols.

In one embodiment, the equalizer can be configured to vary the delay when any of the one or more previously received symbols is different from the symbol of interest, and can be configured to maintain a constant delay if the one or more previously received symbols is the same as the symbol of interest.

In a specific embodiment, the invention provides a method of equalizing deterministic jitter. The method includes determining a logic value for a recovered symbol. The method determines a logic value of at least one prior symbol received prior to the recovered symbol. The method compares the logic value of the recovered symbol to the logic value of at least one prior symbol and adjusts a variable time delay positioned in a serial communication data path based in part on the result of the comparison.

In another specific embodiment, the invention provides an alternative method of equalizing deterministic jitter. The method includes sampling a serial data stream at a first time instant, then sampling the serial data stream at a predetermined time delay following the first time instant. The method then compares the logic level of the serial data stream at the first time instant to the logic level of the serial data stream at the predetermined time delay following the first time instant.

In another specific embodiment, the invention provides an alternative method of equalizing deterministic jitter. The method includes comparing a logic value of a symbol from a serial data stream with a previously received logic value from the serial data stream, and adjusting a period of the symbol based in part on the comparison.

In another specific embodiment, the invention provides an alternative method of equalizing deterministic jitter. The method includes delaying, by a variable time delay, a serial data stream to generate a delayed serial data stream. The method also includes determining a logical XOR of a symbol from the delayed serial data stream with a prior symbol from the delayed serial data stream, and adjusting the variable time delay based in part on a result of the logical XOR.

In another specific embodiment, the invention provides an alternative method of equalizing deterministic jitter. The method includes receiving a serial data stream configured to operate at a symbol rate greater than approximately 6 Giga-symbols per second. The method also provides for determining if one or more logic transitions occurred within a plurality of previously recovered symbols from the serial data stream. The method includes varying a time delay applied to the serial data stream based in part on the one or more logic transitions.

In another specific embodiment, the invention provides an apparatus for equalizing deterministic jitter. The apparatus includes a variable time delay module configured to receive a serial data stream and output a delayed serial data stream. The apparatus also includes a comparator module configured to compare a symbol from the delayed serial data stream to one or more previously received symbols and generate a comparator output. The apparatus includes a control module configured to control a delay provided by the variable time delay module based at least in part on the comparator output.

Many benefits are achieved by way of the present invention over conventional techniques. For example, the methods provide for a deterministic jitter equalizer that is relatively easy to implement in existing data receivers. The deterministic jitter equalizer can be scaled and delay optimized for a variety of deterministic jitter sources, including bandwidth limited channels and symbol reflections in transmission lines. Compensating for deterministic jitter in a clock recovery circuit can improve the phase noise of the recovered clock signal. The deterministic jitter equalizer can ensure that data transitions occur more uniformly relative to a predetermined threshold. A corresponding data eye for deterministic equalized data can show a greater margin, or eye opening. Depending on the embodiment, one or more of these benefits can be achieved.

Various features and advantages of the present invention can be more fully appreciated with reference to the detailed description and accompanying drawings that follow.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

FIGS. 3A-3D are simplified functional block diagrams of embodiment of a deterministic jitter equalizer.

DETAILED DESCRIPTION OF THE DISCLOSURE

A deterministic jitter equalizer and a method of equalizing deterministic jitter are disclosed. The deterministic jitter equalizer can be configured to vary a time delay in a received signal path based at least in part on the state of previously received data. In one embodiment, the deterministic jitter equalizer can determine whether one or more data transitions occurred in one or more previously received data bits or symbols and adjust the delay in the signal path based in part on a position of the one or more data transitions. The deterministic data equalizer can be configured to adjust the delay to match the delay introduced by data dependent jitter sources.

Figure 1:
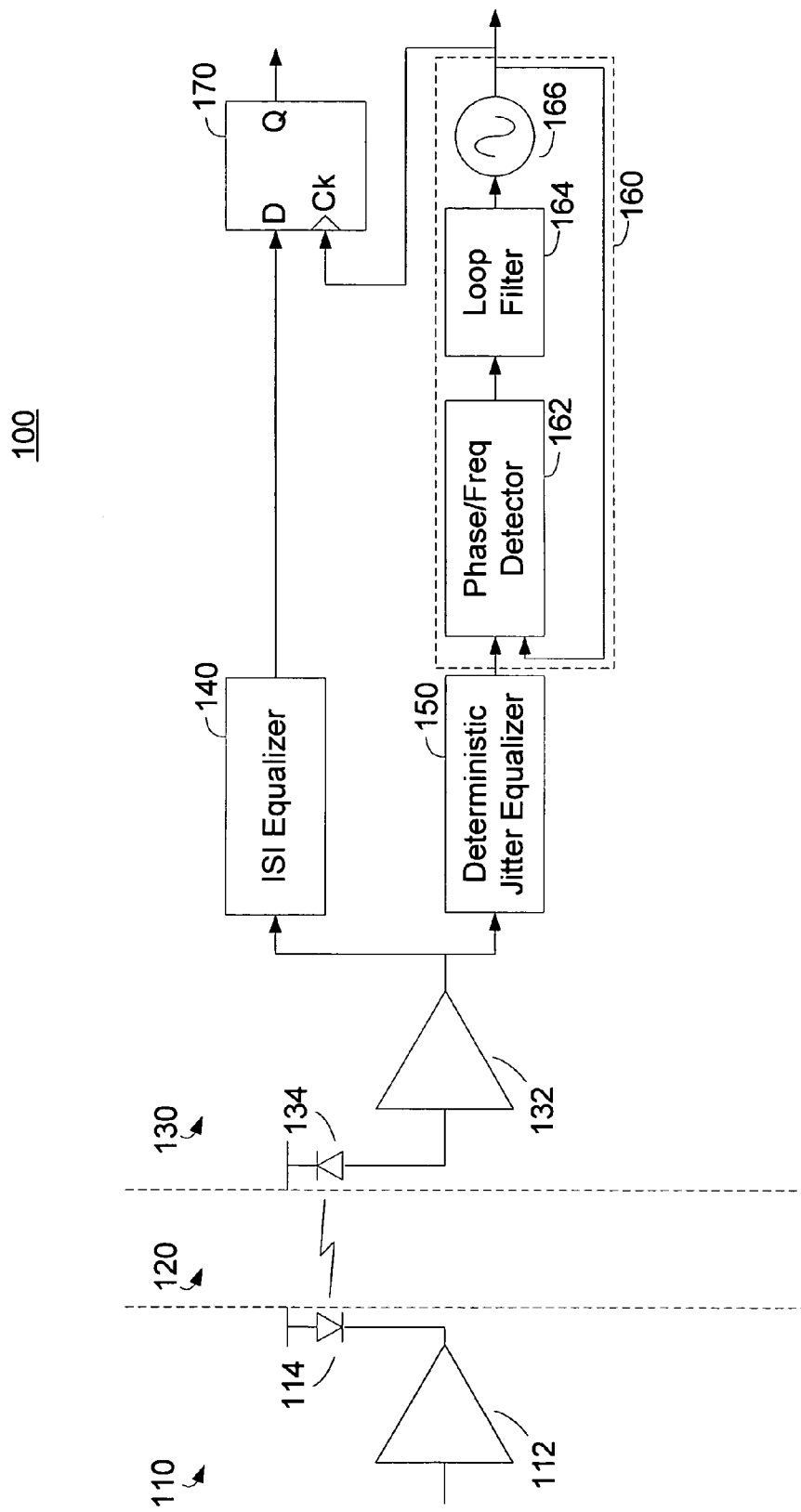
FIG. 1 is a simplified functional block diagram of an embodiment of a serial data communication link incorporating a deterministic jitter equalizer.

FIG. 1 is a functional block diagram of an embodiment of a serial data communication system 100 incorporating the deterministic jitter equalizer. The serial data communication system 100 can include a transmitter 110 communicating over a channel 120 to a receiver 130. In the embodiment shown in FIG. 1, the transmitter 110 and receiver 130 are configured to interface through an optical channel 120. The optical channel 120 can be a free space optical channel, an optical fiber, or some other optical link.

However, the disclosed methods and apparatus are not limited to an optical channel 120, but are applicable to other types of communication channels 120. For example, the channel 120 can be a wired link, such as single ended wireline, twisted pair, coaxial, microstrip, stripline, and the like, or some other conductor based wired link. A typical high-speed wireline link can be, for example, an electrically conductive data line on a backplane. Additionally, the channel 120 can be a wireless channel, such as a free space channel, a waveguide, and the like, or some other wireless channel. Additionally, the channel 120 can be any combination of optical, wired, and wireless channels.

The transmitter 110 can be configured to include an amplifier 112 configured to receive a serial data stream. The serial data stream provided to the input of the amplifier 112 can be considered the reference data stream that an ideal receiver would recover. The serial data stream can include a series of symbols, which in the case of binary data can represent a series of bits. The serial data stream can be a high speed data stream configured to have a symbol rate greater than about 6 Giga symbols per second (Gsps). In other embodiments, the serial data stream can be configured to operate at a rate of greater than approximately 7, 8, 9, or 10 Gsps. In the embodiment of FIG. 1, the amplifier 112 is configured to drive an optical source 114 which can be, for example, a Light Emitting Diode (LED), a laser diode, or a laser.

The output from the optical source 114 is coupled to an optical detector 134 in the receiver 130 via the channel 120. The output of the optical detector 134 can be coupled to an amplifier 132 that can include one or more amplification stages, including, but not limited to, a low level amplifier, which may be a low noise amplifier, and a line amplifier.

Because the components within the transmitter 110 and receiver 130, and the channel, are bandwidth limited and non-ideal, the serial data stream at the output of the amplifier 132 will likely not match the input serial data stream at the transmitter 110. The transfer functions of the various components can introduce deterministic, data dependent, jitter into the serial data stream. The deterministic jitter is a form of signal distortion in which previously transmitted signal values determine the initial conditions for the current transmitted data. As a result, different data sequences result in different arrival times.

The bandwidth of the channel, or the bandwidth of one or more components within the transmitter 110 and receiver 130 may be less than the symbol rate of the serial data stream. For example, it is typical for the serial data communication system 100 to be bandwidth limited to a bandwidth that is less than approximately 80%, 70%, 60%, or even 50% of the symbol rate. Thus, in an embodiment in which the symbol rate is 10 Gsps, the bandwidth of the serial data communication system 100 may be limited to less than 5 GHz.

In a typical serial data communication system 100, the clock signal is recovered from the serial data stream. Jittered data degrade the performance of clock recovery because the changing edge timing of the recovered data stream results in deviations in a phase detector output that is typically used to modulate a voltage controlled oscillator (VCO) used to generate the recovered clock signal.

Jitter in the clock signal can result in a shifting sampling point for the received data stream. If the jittered clock is used in to sample the received data stream in a data recovery module, the result is jittered data, because the clock does not optimally sample a data eye. Jittered data reduces timing margins, thereby closing the data eye and increasing the probability of error.

The output of the amplifier 132 can be coupled to a clock and data recovery (CDR) module within the receiver 130. The CDR module can be configured to recover the clock and compensate for the effects of deterministic jitter.

The output of the amplifier 132 in the receiver 130 can be coupled to inputs of an Inter-Symbol Interference (ISI) equalizer 140 in a data recovery path and a deterministic jitter equalizer 150 in a clock recovery path. The ISI equalizer 140 can be configured to compensate for at least a portion of the ISI. For example, the ISI equalizer 140 can be configured to compensate for at least a portion of the ISI contributed by the channel 120. The output of the ISI equalizer 140 can be coupled to a data input of a D flip-flop 170 that can be configured to generate the recovered data.

The deterministic jitter equalizer 150 can be configured to determine a timing delay to be applied to a present bit or symbol based on previously received data. Various embodiments of the deterministic jitter equalizer 150 are described in further detail in relation to FIGS. 2A-2B and 3A-3B. The deterministic jitter equalizer 150 can be configured to compensate for the effects of deterministic jitter in the clock signal. The clock signal is used to clock the received data to produce recovered data that can be retimed to remove the effects of deterministic jitter.

The output of the deterministic jitter equalizer 150 can be coupled to a clock recovery circuit 160 that is based on a phase locked loop (PLL). The output of the deterministic jitter equalizer 150 can be coupled to a first input of a phase/frequency detector 162. In one embodiment, the output of the deterministic jitter equalizer 150 can be coupled to a reference input of the phase/frequency detector 162. A VCO 166 configured to provide the recovered clock output can be coupled to a second input of the phase/frequency detector 162.

The phase frequency/detector 162 can be configured to compare the phase of the two input signals and output a control signal based on the comparison. The output of the phase/frequency detector 162 can be coupled to a loop filter 164, that is typically configured as a low pass filter.

The loop filter 162 defines the bandwidth of the PLL and operates to smooth sudden changes in the control voltage. The output of the loop filter 162 can be coupled to the control input of the VCO 166.

The output of the VCO 166 represents the recovered clock signal. The output of the VCO 166 can be coupled to a clock input of the D flip-flop. The recovered clock signal is compensated for deterministic jitter and is used to clock the D flip-flop to provide a recovered data signal having timing compensated for the effects of deterministic jitter.

Figure 2A:
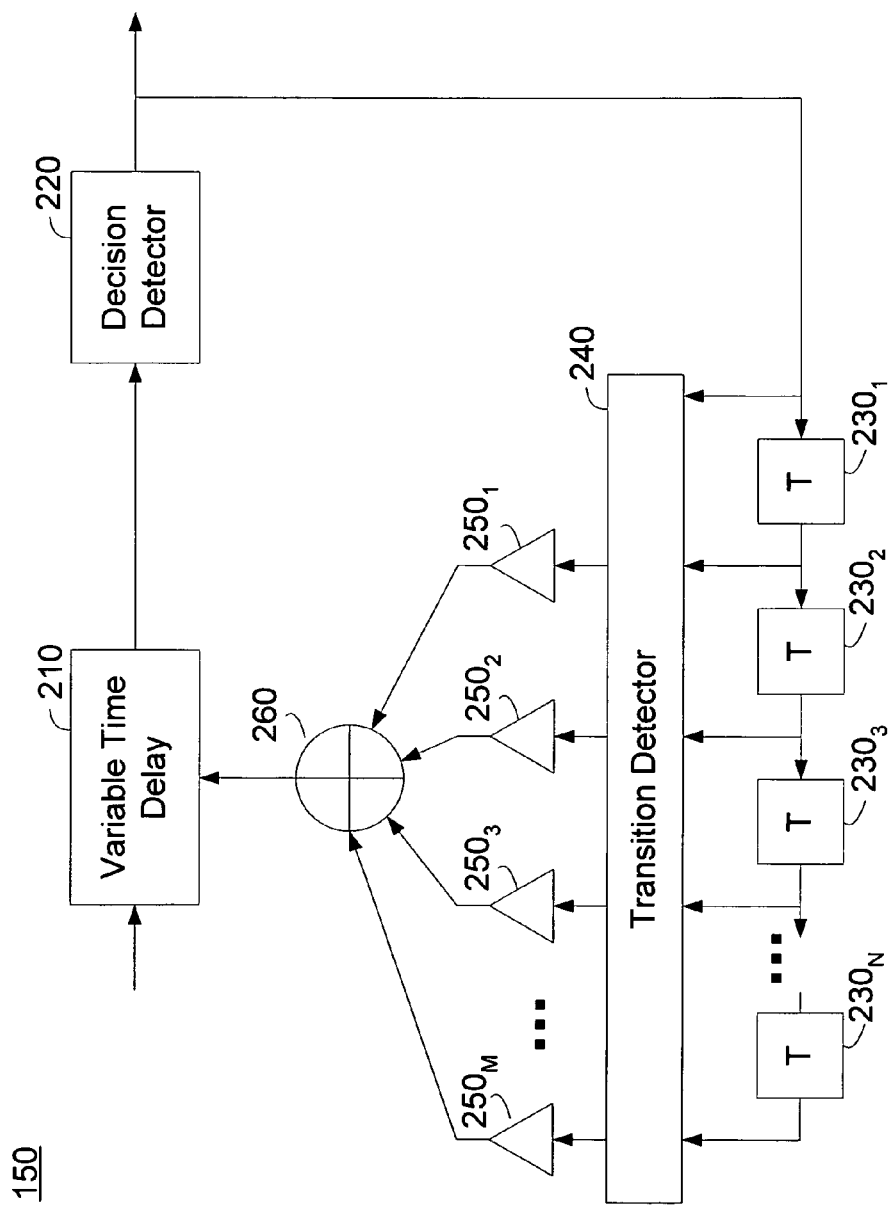
FIGS. 2A-2B are simplified functional block diagrams of embodiments of a deterministic jitter equalizer.

FIG. 2A is a functional block diagram of an embodiment of a deterministic jitter equalizer 150, such as the one shown in the system 100 of FIG. 1. The deterministic jitter equalizer 150 includes a variable time delay 210 coupled to an input of the equalizer. The variable time delay 210 can be configured to introduce a time delay that is based on a control input value. The input of the variable time delay 210 can receive the jittered, or uncompensated data.

The output of the variable time delay 210 can be coupled to a decision detector 220 that can be configured to determine a logic state of an output of the variable time delay 210. For example, the decision detector 220 configured for binary logic may be configured to determine if the output from the variable time delay 210 represents a logical "1" or a logical "0." In systems having more than two logic levels, the decision detector 220 may be configured to determine which of the plurality of logic levels is represented by the output of the variable time delay 210. The output from the decision detector 220 represents the recovered data.

The output of the decision detector 220 can be coupled to an input of a first predetermined delay module $230_1$. The output of the decision detector can also be coupled to a first input of a transition detector 240. The output of the first predetermined delay module $230_1$ can be coupled to a series arrangement of subsequent predetermined delay modules $230_2$-$230_N$. The output of each of the subsequent predetermined delay modules $230_2$-$230_N$ is coupled to a corresponding input of the transition detector 240.

In one embodiment, each of the predetermined delay modules $230_1$-$230_N$ is configured to provide the same time delay and each module can provide a time delay that is substantially equal to the duration of one symbol period. In such an embodiment, the deterministic jitter module 150 can be configured to provide a delay based in part on the N immediately preceding symbols.

In other embodiments, the predetermined delay modules $230_1$-$230_N$ can be configured to provide different delay values that each can be, for example, integer multiples of a symbol period. In such an embodiment, the deterministic jitter module 150 can be configured to provide a delay based in part on N previous symbols that are not necessarily contiguous. In another embodiments, not all of the outputs from the predetermined delay modules $230_1$-$230_N$ are coupled to the transition detector 240. Thus, the delay from the variable time delay can be determined based on less than N previous symbols.

The transition detector 240 can be configured to determine if a logical transition occurred between the symbols coupled by the predetermined delay modules $230_1$-$230_N$. For a system configured for binary data, there are $2^N$ possible states corresponding to the N previous symbols. More generally, for a system having k possible logic states, the transition detector 240 can analyze $k^N$ possible states.

The transition detector 240 can be configured to provide an indication of each detected transition. For example, the transition detector 240 can be configured to provide M outputs, with each output indicating a logic level transition that is based at least in part on a comparison of the most recent symbol and a previously received symbol. Typically, the number of outputs, M, can be one less than the number of inputs, N.

Each of the M outputs from the transition detector 240 can be coupled to a corresponding amplifier $250_1$-$250_M$. Each of the amplifiers $250_1$-$250_M$ can be configured to scale the output of the transition detector by a predetermined scale factor. The predetermined scale factor can be based on a contribution of the particular symbol transition to the deterministic jitter.

The outputs of each of the amplifiers $250_1$-$250_M$ can be coupled to a summer 260. The summer 260 can sum all of the amplifier outputs into a single control signal that can be applied to the control input of the variable time delay 210 to adjust the time delay to compensate for the deterministic jitter attributable to previous symbol transitions.

The variable time delay 210 can thus be configured to provide a time delay that is based on a number of transitions in the N previous symbols. In one embodiment, the variable time delay 210 can be configured to provide a nominal delay corresponding to no transitions in any of the previous N symbols. A symbol transition may contribute to jitter by delaying the time required for the data to reach a transition threshold value detected by the decision detector 220. Thus, the delay introduced by the variable time delay 210 can be adjusted for transitions in the previous N symbols. In one embodiment, the variable time delay 210 can be configured to reduce the delay time relative to the nominal delay time for each detected transition. In another embodiment, the variable time delay 210 can be configured to increase the delay time relative to the nominal delay time for each detected transition.

For example, in an embodiment configured to examine the previous two symbols in addition to the present output from the decision detector 220, two predetermined delay modules $250_1$ and $250_2$ can be used and three signals can be coupled to the input of the transition detector 240. The transition detector 240 can be configured to determine if transitions occurred between any two adjacent symbols. Two outputs from the transition detector 240 can indicate the presence of the symbol transitions. A first output can be configured to indicate a transition from the previously occurring symbol to the present output symbol. A second output can be configured to indicate a transition from the oldest symbol to the previously occurring symbol.

The more recent symbol transitions may affect deterministic jitter more than older symbol transitions. Thus, a first amplifier $250_1$ can be configured to scale the first transition detector 240 output by a larger factor than a second amplifier $250_2$ coupled to the second transition detector 240 output.

Figure 2B:
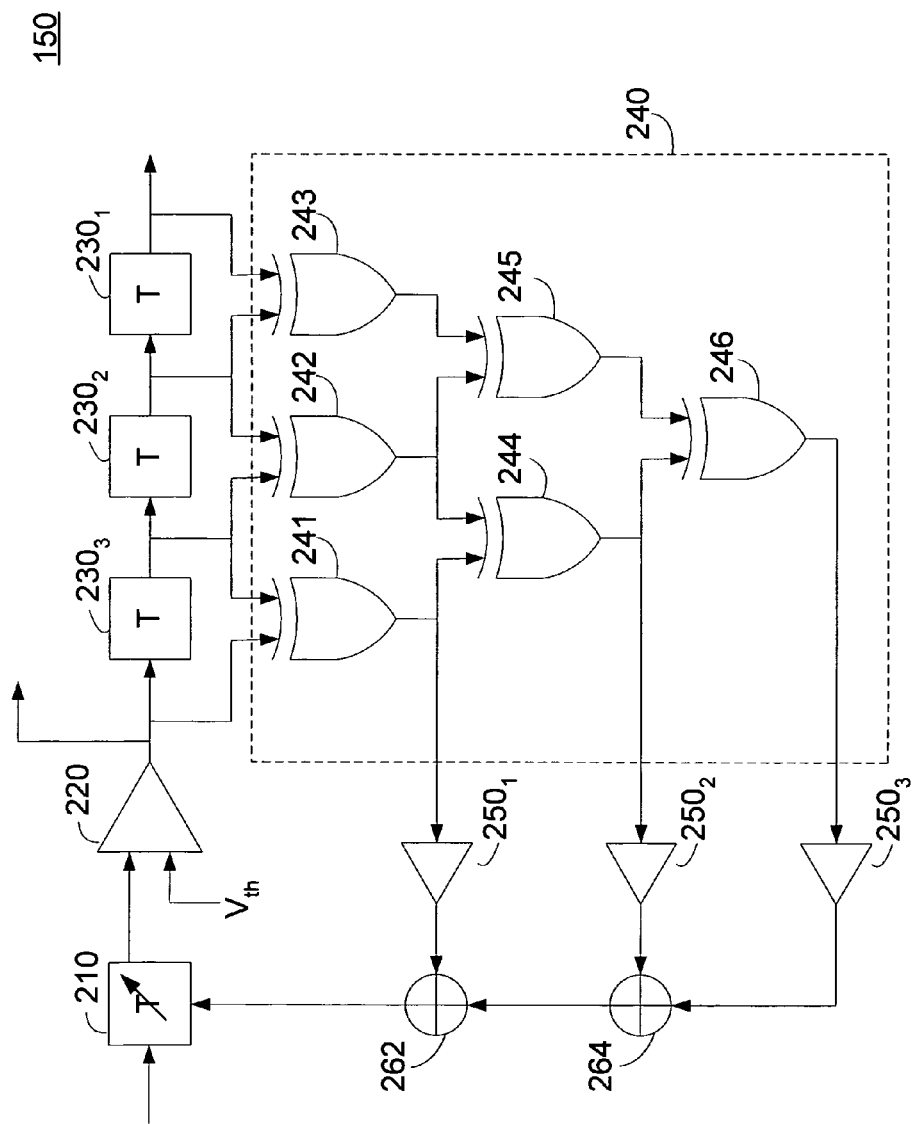

FIG. 2B is another functional block diagram of an embodiment of a deterministic jitter equalizer 150, such as the one shown in the system 100 of FIG. 1. The deterministic jitter equalizer 150 of FIG. 2B is configured to determine a variable time delay based in part on the most recent symbol and three previously occurring symbols.

The deterministic jitter equalizer 150 is configured for binary data. The jittered data is coupled to an input of the variable time delay 210. The output of the variable time delay is coupled to an input of a decision detector 220. The decision detector 220 can be configured as a comparator having a first input coupled to the output of the variable time delay 210 and a second input coupled to a voltage source set to a predetermined threshold voltage, $V_{th}$. The output of the decision detector 220 represents the un-jittered data, also referred to as the corrected data, compensated data, retimed data, or recovered data.

The output of the decision detector 220 is coupled to a first delay module 2301. The output of the first delay module $230_1$ is coupled to an input of a second delay module $230_2$. Similarly, the output of the second delay module $230_2$ is coupled to an input of a third delay module $230_3$. Each of the delay modules $230_1$-$230_3$ is configured to provide a time delay substantially equal to a symbol period.

The input to each of the delay modules $230_1$-$230_3$ is also coupled to a corresponding input of a transition detector 240. Similarly, the output of the third delay module $230_3$ is coupled to an input of the transition detector 240.

The transition detector 240 is configured with a plurality of two input exclusive "OR" (XOR) gates configured to determine the number of and position of transitions in the last four recovered symbols. A first XOR gate 241 has inputs coupled the most recent recovered symbol and the symbol received immediately prior, corresponding to the input and output of the first delay module $230_1$. Similarly, a second XOR gate 242 has its inputs coupled to the input and output of the second delay module $230_2$. A third XOR gate 243 has its inputs coupled to the input and output of the third delay module $230_3$.

Thus, the first XOR gate 241 can determine if a logic transition occurred between the most recent recovered symbol and the first, or most recent, previously recovered symbol. The second XOR gate 242 can determine if a logic transition occurred between the first previously recovered symbol and the second previously recovered symbol. Similarly, the third XOR gate 242 can determine if a logic transition occurred between the second previously recovered symbol and the third, or oldest, previously recovered symbol.

The output of the first XOR gate 241 is also coupled to an input of a first amplifier $250_1$. The output of the first amplifier $250_1$ is coupled to a first summer 262 that sums the first amplifier $250_1$ output with an output from a second summer 264. If the first XOR gate 241 determines no transition occurred, the input signal to the first amplifier $250_1$ can be zero and there is no contribution to the control voltage of the variable time delay 210. If the first XOR gate 241 determines a transition occurred, the input signal to the first amplifier $250_1$ can be a predetermined value that is then scaled by the first amplifier $250_1$ to an appropriate incremental control voltage for the variable time delay 210.

Ideally, the incremental control voltage corresponds to the effect on data jitter contributed by the determined logic transition. The incremental control voltage can be determined, for example, by characterizing the variable time delay 210 relative to control voltage. The amount of jitter compensation can be measured empirically, or can be estimated based on the signal bandwidths of the various contributing elements in the transmitter and receiver.

The output of the first XOR gate 241 is also coupled to an input of a fourth XOR gate 244. The output of the second XOR gate 242 is coupled to the other input of the fourth XOR gate 244. The fourth XOR gate 244 can determine if the three most recent logic levels are the same or if a logic transition occurred during the most recent three symbols. The output of the fourth XOR gate 244 is coupled to a second amplifier $250_2$ configured to scale the value to an appropriate incremental control voltage for the variable time delay 210. The scaled output is coupled to an input of the second summer 264. If the fourth XOR gate 244 determines that no transitions occurred, there is no change to the delay. If a signal transition occurred in the three most recent symbols, the appropriate adjustment in the delay control value is made. However, no adjustment is made if logic transitions were detected by both the first and second XOR gates 241 and 242. The output of the fourth XOR gate 244 is coupled to an input of a sixth XOR gate 246.

A fifth XOR gate 245 has inputs coupled to the outputs of the second and third XOR gates 242 and 243. The fifth XOR gate 245 can determine if a logic transition occurred during the three oldest symbols from the three delay modules $230_1$-$230_3$. The fifth XOR gate 245 does not indicate if transitions were detected by both the second and third XOR gates 242 and 243. The output of the fifth XOR gate 245 is coupled to a second input of the sixth XOR gate 246.

The sixth XOR gate 246 can determine if a transition occurred during most recent three symbols or the oldest three symbols, but provides no correction if transitions occurred in both or if an alternating transition pattern occurred. The output of the sixth XOR gate 246 is coupled to an input of a third amplifier $250_3$ configured to scale the output to an appropriate incremental control voltage for the variable time delay 210.

The output of the second summer 264 is summed in the first summer 262 with the output of the first amplifier $250_1$. The output of the first summer 262 is coupled to the control input of the variable time delay 210.

FIG. 3A is a functional block diagram of an embodiment of a first scale deterministic jitter equalizer 150. The term first scale refers to a jitter adjustment based on a determination of a transition occurring within two symbols. The two symbols are typically the two most recent recovered symbols. Typically, the most recent recovered symbols provide the greatest contribution to deterministic jitter, but such is not always the case. For example, older data transitions may have a greater effect on data jitter where signal reflections or signal multipaths dominate.

The deterministic jitter equalizer 150 of FIG. 3A is configured to operate on binary data. An input of the deterministic jitter equalizer 150 is configured to receive the jittered data and couple it to a first input of a multiplexer 320 and to an input of a static delay module 310 configured to introduce a delay that compensates for an amount of data jitter resulting from a data transition in the last two recovered symbols. The output of the static delay module 310 is coupled to a second input of the multiplexer 320.

The multiplexer 320 can be, for example, an analog multiplexer configured to pass the jittered data without introducing substantially more jitter. An output of the multiplexer is coupled to a decision detector 220. The decision detector 220 can be a comparator having a reference input coupled to a reference voltage source set to a threshold voltage.

The output of the decision detector 220 represents the recovered data. The output of the decision detector 220 is coupled to a delay module 230 configured to delay the recovered data by a duration substantially equal to a symbol period. A delay of substantially one symbol period can be generated using a D flip-flop clocked with a recovered clock signal, or alternatively a cascaded pair of D flip-flops clocked off of opposite phases of a clock. The output of the decision detector 220 is also coupled to a first input of an XOR gate 330.

The output of the delay module 230 is coupled to a second input of the XOR gate 330. The XOR gate 330 is configured to determine if a logic transition occurred between the present recovered symbol and the most recent previously recovered symbol. The output of the XOR gate 330 is coupled to an input of a combiner 340. A constant value representing a default multiplexer 320 control signal can be applied to a second input of the combiner 340. The output of the combiner 340 is coupled to a control input of the multiplexer 320 and controls the multiplexer 320 to select one of the multiple input signals to couple to its output. The multiplexer 320 can thus be configured to pass the jittered data directly or a delayed version of the jittered data depending on whether a logic transition occurred in the last two recovered symbols.

In one embodiment, the combiner 340 is a summer configured to sum the output of the XOR gate 330 with the constant value. The summer can be, for example, a modulo-2 summer. In another embodiment, the combiner 340 can be a multiplier that is configured to scale the constant value with the output of the XOR gate 330.

FIG. 3B is a functional block diagram of another embodiment of a first scale deterministic jitter equalizer 150. The deterministic jitter equalizer 150 of FIG. 3B incorporates a variable time delay 210 instead of the multiplexer 320 and static delay module 310 of the deterministic jitter equalizer 150 of FIG. 3A. Otherwise, the operation of the deterministic jitter equalizer 150 of FIG. 3B is substantially identical to that of FIG. 3A.

An input of the deterministic jitter equalizer 150 is configured to receive jittered data and couple the data to an input of a variable time delay 210. The amount of the delay is configured based on a value of a control input. The output of the variable time delay 210 is coupled to an input of a decision detector 220 configured as a comparator having a second input coupled to a reference voltage source set to a threshold voltage. The output of the decision detector represents the recovered symbol. The output of the decision detector 220 is also coupled to a first input of an XOR gate 330.

The output of the delay module 230 is coupled to a second input of the XOR gate 330. The XOR gate 330 is configured to determine if a logic transition occurred between the present recovered symbol and the most recent previously recovered symbol. The output of the XOR gate 330 is coupled to an input of a combiner 340. A constant value representing a default variable time delay 210 control signal can be applied to a second input of the combiner 340. The output of the combiner 210 is coupled to the control input of the variable time delay 210.

FIG. 3C is another embodiment of a deterministic jitter equalizer 150. The deterministic jitter equalizer 150 of FIG. 3C incorporates the function of the variable time delay into the decision detector 220. The deterministic jitter equalizer 150 of FIG. 3C varies the threshold voltage in the decision detector 220 to effectuate a delay rather than implementing a delay module before a decision detector having a constant threshold voltage as in FIGS. 3A and 3B.

The deterministic jitter equalizer 150 of FIG. 3C couples the jittered data to a first input of the decision detector 220. The decision detector 220 is a comparator having a second input that is configured to control the transition level for the jittered data. Varying the threshold voltage effectively varies the time required for the jittered data to transition from one logic level to another. For example, in binary logic, raising the threshold voltage increases the time for a low to high transition but decreases the time for a high to low transition. Likewise, decreasing the threshold voltage increases the transition time for a high to low transition but decreases the time for a low to high transition. Therefore, the choice to increase or decrease the threshold voltage can depend on the present state of the recovered data.

The output of the decision detector 220 represents the recovered data. The output of the decision detector 220 is coupled to an input of a delay module 230 configured to provide substantially one symbol period delay. The output of the decision detector 220 is also coupled to a first input of an XOR gate 330 and an input of a gain stage 332.

The output of the delay module 230 is coupled to a second input of the XOR gate 330. The output of the XOR gate 330 indicates whether a logic transition occurred during the two most recent symbols of the recovered data. The output of the XOR gate 330 is coupled to another input of the gain stage 332. The output of the gain stage 332 is coupled to an input of a summer 340 where the value is summed with a nominal threshold voltage value. The sum of the nominal threshold voltage and the output of the gain stage 332 is coupled to the reference input of the decision detector 220.

The gain stage 332 can be configured to scale the output of the XOR gate 330. If there is no logic transition, there is no change made to the threshold voltage. If there is a logic transition, the threshold voltage is compensated for deterministic jitter. Ideally, the output of the gain stage 332 is an incremental value that results in an increase or decrease of the threshold voltage in the decision detector 220. The incremental value should vary the time for data to reach the threshold voltage by the amount of jitter in the symbol.

The gain stage 332 can be configured to selectively invert the gain based on a value of the most recent recovered symbol. Because increase in the threshold voltage can either increase or decrease the time to transition based on the direction of the data transition, the gain stage 332 can be configured to provide a voltage offset based in part on the most recent symbol. For example, if the most recent symbol is a logic high and a transition is detected, the gain stage 332 can be configured for a negative gain to decrease the threshold voltage and increase the time for a subsequent transition to occur. On the other hand, if the most recent symbol is a logic low and a transition is detected, the gain stage 332 can be configured for a positive gain to increase the threshold voltage, thereby increasing the time for a subsequent transition to occur.

FIG. 3D is a functional block diagram of another embodiment of a deterministic jitter equalizer 150. The configuration of the deterministic jitter equalizer 150 of FIG. 3D is similar to the configuration shown in FIG. 3B. However, the deterministic jitter equalizer 150 of FIG. 3D is configured to apply distinct jitter corrections for rising and falling edge transitions.

The jittered data is provided to an input of a variable time delay 210 that can be configured to provide a delay based on one of two separate delay control inputs. In one embodiment, the variable time delay 210 can be configured to sum the two control signals. In another embodiment, the variable time delay 210 can be configured to select one or the other control input signal based on a select signal (not shown).

The output of the variable time delay 210 represents the recovered data and is coupled to the input of the decision detector 220. The output of the decision detector is coupled to a delay module 230 configured to provide a delay of substantially one symbol period.

The recovered data output from the decision detector 220 is also coupled to two distinct NAND gates 352 and 352 configured to detect, respectively, falling and rising transitions. The output of the decision detector 220 is coupled to a first input of a first NAND gate 352. The delayed output from the delay module 230 is inverted and coupled to a second input of the first NAND gate 352. The first NAND gate 352 is thus configured to determine if a falling transition occurred, that is, if the previously received symbol is a logic high and the most recent received symbol is a logic low. The output of the first NAND gate 352 is coupled to an input of a first combiner 342. A nominal control voltage to produce a time delay for falling transitions can be coupled to another input of the first combiner 342. The first combiner 342 can be configured as a multiplier and can scale control voltage with the NAND gate 352 output. The output of the first combiner 342 is coupled to a control input of the variable time delay 210.

The output of the decision detector 220 is also inverted and coupled to a first input of a second NAND gate 354. The delayed output from the delay module 230 is coupled to a second input of the second NAND gate 354. The second NAND gate 354 is thus configured to determine if a rising transition occurred, that is, if the previously received symbol is a logic low and the most recent received symbol is a logic high. The output of the second NAND gate 354 is coupled to an input of a second combiner 344. A nominal control voltage to produce a time delay for rising transitions can be coupled to another input of the second combiner 344. The output of the second combiner 344 is coupled to a control input of the variable time delay 210. Thus, the deterministic jitter equalizer 150 can be configured to provide distinct delays to independently compensate jitter attributable to rising and falling transitions.

Figure 4:
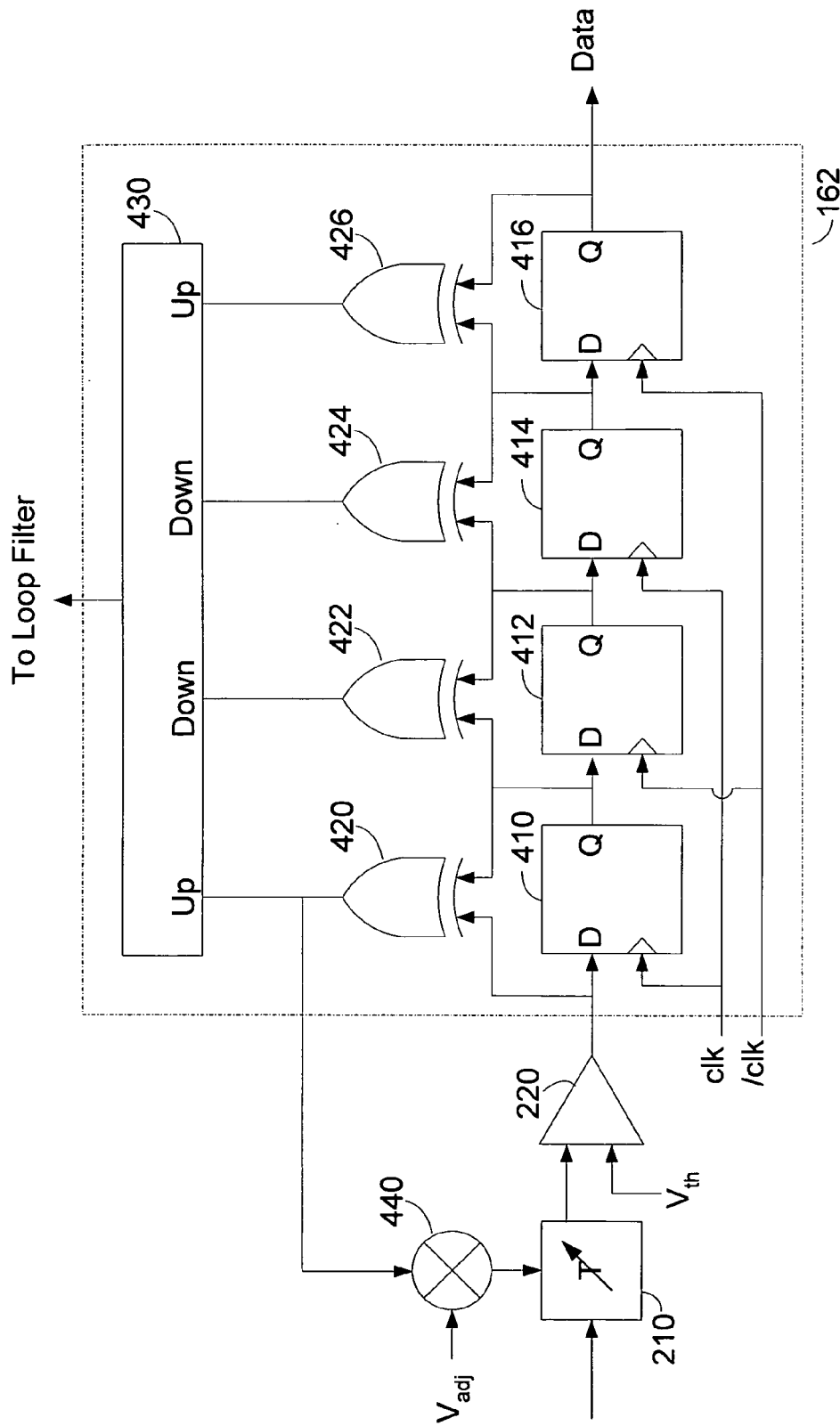
FIG. 4 is a simplified functional block diagram of an embodiment of a phase detector configured to operate as a portion of a deterministic jitter equalizer.

FIG. 4 is a functional block diagram of an embodiment of a phase detector 162 configured to operate as a portion of a deterministic jitter equalizer. In the functional block diagram of FIG. 4, the symbol period delay, decision detector, and XOR gate for a first scale deterministic jitter equalizer are shared with a Hogge phase detector 162. Thus, a deterministic jitter equalizer requires a minimal number of additional parts and can be configured from a Hogge phase detector 162 using an additional variable time delay 210 and a combiner 440.

The Hogge phase detector 162 includes four cascaded D flip-flops 410, 412, 414, and 416, with the Q output from a D flip-flop, for example 410, coupled to the D input of the next D flip-flop, 412 in this example. The four D-flip-flops 410, 412, 414, and 416 are clocked on alternating edges of a clock signal. The first and third D flip-flops, 410 and 414 respectively, are clocked from a clock signal, and the second and fourth D flip-flops, 412 and 416 respectively, are clocked from an inverted clock signal.

An XOR gate is coupled across each D flip-flop, with one XOR input at the input to the D flip-flop and another XOR input a the output of the D flip-flop. Therefore, a first XOR gate 420 has inputs coupled to the input and output of the first D flip-flop 410, a second XOR gate 422 has inputs coupled to the input and output of the second D flip-flop 412, a third XOR gate 424 has inputs coupled to the input and output of the third D flip-flop 414, and a fourth XOR gate 426 has inputs coupled to the input and output of the fourth D flip-flop 416.

The outputs of each of the D flip-flops 410, 412, 414, and 416 are coupled to an up/down counter 430. The output of the first and fourth D flip-flops 410 and 416 are coupled to corresponding "up" count inputs of the up/down counter 430. The output of the second and third D flip-flops 412 and 414 are coupled to corresponding "down" count inputs of the up/down counter 430. The output of the up/down counter 430 can be coupled to a loop filter (not shown) of a clock recovery circuit.

The deterministic jitter equalizer can be implemented with the phase detector 162 by coupling a variable time delay 210 to a decision detector 220 that has an output coupled to the input of the phase detector 162. The input of the variable time delay 210 receives the jittered data. The output of the decision detector 220 represents the recovered data.

The first D-flip-flop 410 can operate as the symbol period delay and the first XOR gate 420 can operate as a transition detector. The output of the first XOR gate 420 can be coupled to an input of a signal combiner that is configured to weight the XOR output with a delay control voltage value. The configuration of the deterministic jitter equalizer is then essentially the same as that shown in FIG. 3B.

In the deterministic jitter equalizer 150 embodiments shown in FIGS. 2B, 3A-3B, and 3D, the decision detector 220 can be incorporated within other elements. For example, in the deterministic jitter equalizer FIG. 3B, a decision detector can be incorporated in each of the time delay module 230 as well as the XOR gate 330. If the delay module 230 is implemented as a D flip-flop, the decision detection can occur when the delayed symbol output from the variable time delay 210 is sampled, such as when the D flip flop is clocked. Similarly, the XOR gate 330 can include a threshold comparator at its input that determines if the input signal is at a high or low logic level.

Figure 5:
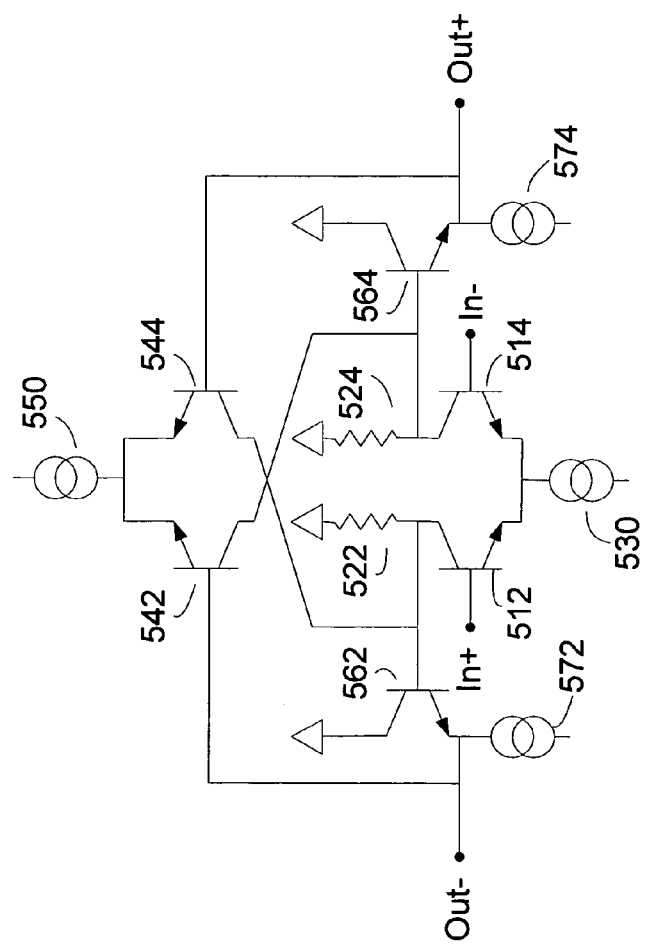
FIG. 5 is a simplified schematic diagram of an embodiment of a variable delay module.

FIG. 5 is a schematic diagram of an embodiment of a variable delay module 500, which can be used as the basis for the variable time delay shown in FIGS. 2A-2B. The variable delay module 500 can be configured as a cross-coupled differential pair. One of the differential pairs is biased with a fast current source and the other differential pair is biased with a slow current source. The total current through the cross coupled differential pair is thus the sum of the slow and fast current sources. Varying the current sources varies the delay through the module, with the delay proportional to the ratio of the slow current source to the fast current source.

The differential input to the variable delay module 500 is coupled to the bases of a first differential pair consisting of first and second transistors, 512 and 514. The collectors of the first and second transistors 512 and 514 are coupled to corresponding first and second resistors, 522 and 524, respectively. The emitters of the first and second transistors 512 and 514 are coupled to the fast current source 530. The value of the fast current source can be controlled by a control input.

The output of the first differential pair is buffered in emitter follower stages that provide the differential output of the variable delay module. The collector of the second transistor 514 is coupled to an emitter follower buffer consisting of a transistor 564 and constant current source 574 configured to provide the positive differential output. The collector of the first transistor 512 is coupled to an emitter follower buffer consisting of a transistor 562 and constant current source 572 configured to provide the negative differential output.

The collectors of the first differential pair are also coupled to the collectors of a second differential pair consisting of third and fourth transistors 542 and 544. The collector of the first transistor 522 is common with the collector of the fourth transistor 544 and the collector of the second transistor 524 is common with the collector of the third transistor 542.

The differential output of the variable delay module 500 is coupled to the bases of the third and fourth transistors 522 and 524. The positive output is coupled to the base of the fourth transistor 544 and the negative output is coupled to the base of the third transistor 542. The emitters of the third and fourth transistors 542 and 544 are coupled to the slow current source the value of the slow current source can be varied by a control input, that can advantageously, be out of phase relative to the control input coupled to the fast current source.

Figure 6:
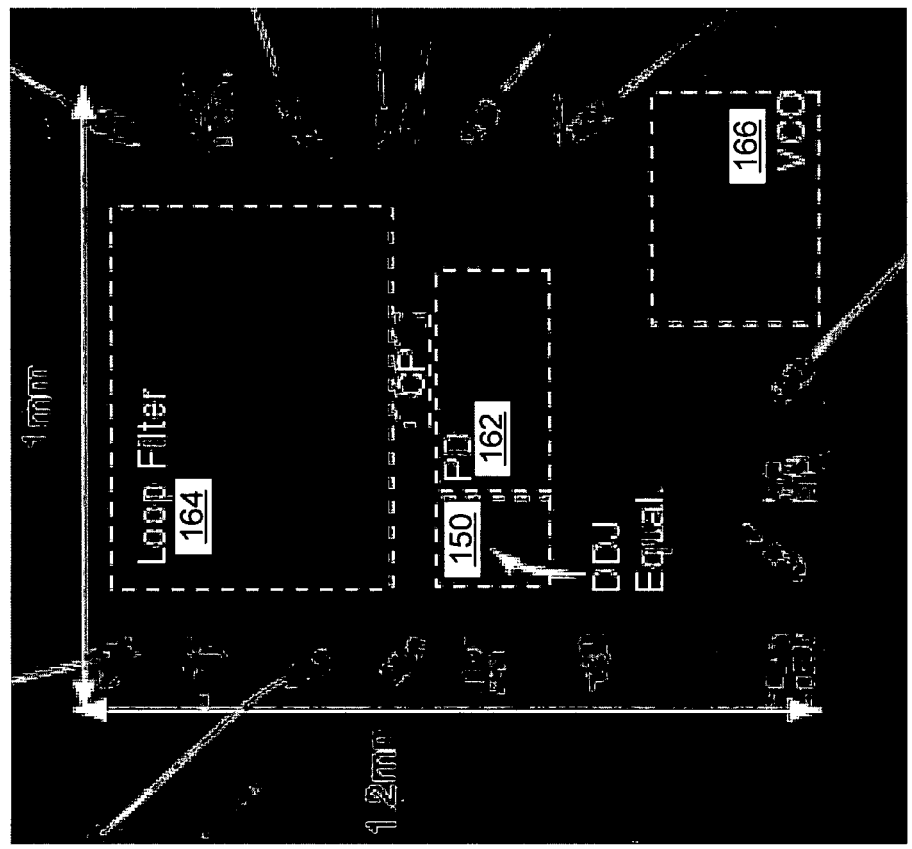
FIG. 6 is a view of an embodiment of a data receiver having a deterministic jitter equalizer implemented within an integrated circuit.

FIG. 6 is a view of an embodiment of a receiver 130 having deterministic jitter equalizer manufactured on an integrated circuit having dimensions of approximately 1 mm×1.2 mm. The integrated circuit was manufactured with a SiGe BiCMOS process. The bipolar transistors have an $f_t$ of approximately 120 GHz. The CMOS are produced with 180 nm process. Of course, other processes can be used and the bipolar transistors can have other $f_t$ values, provided the circuit characteristics are sufficient to function at the desired data rate.

The integrated circuit receiver 130 includes a deterministic jitter equalizer having dimensions of approximately 200 μm×150 μm. The receiver 130 also includes a VCO 166, phase detector 162 having a charge pump, and loop filter 164.

The receiver 130 was tested with a 10 Gbps pseudorandom bit stream coupled across a copper transmission line manufactured on an FR-4 backplane. The transmission line on the FR-4 backplane has a bandwidth of approximately 5 GHz, and thus contributes substantially to deterministic jitter. The inclusion of the deterministic jitter equalizer improved phase noise of the VCO output by approximately 12 dB at an offset of 100 kHz and 8 dB, measured at an offset of 1 MHz. Additionally, the standard deviation of the timing jitter improved (reduced) by approximately 30% by incorporating a first scale deterministic jitter equalizer.

Figure 7:
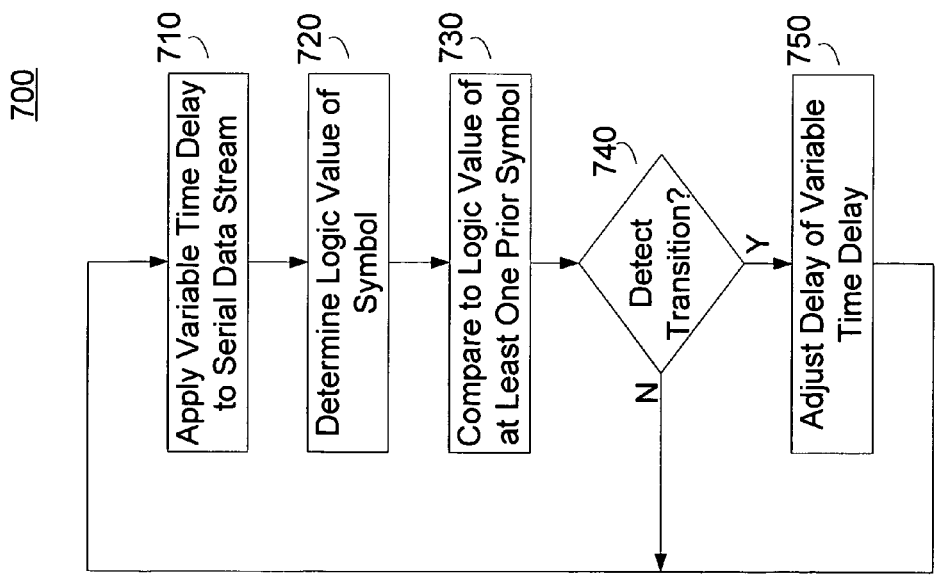
FIG. 7 is a simplified flowchart of an embodiment of a method of deterministic jitter equalization.

FIG. 7 is a flowchart of a method 700 of equalizing deterministic jitter. The method 700 can be performed, for example, by the deterministic jitter equalizers shown in FIG. 2A-2B, 3A-3D, or 4.

The method begins at block 710 where the deterministic jitter equalizer applies a variable time delay to a serial data stream. The deterministic jitter equalizer proceeds to block 720 and determines a logic value of a symbol from the serial data stream. The deterministic jitter equalizer can determine the logic value, for example, by sampling the serial data stream, or comparing the serial data stream to a threshold value. The logic value can be, for example, a binary logic value or an M-ary logic value. The deterministic jitter equalizer then proceeds to block 730 and compares the determined logic value to the logic value of one or more prior symbols received prior to the symbol.

The deterministic jitter equalizer proceeds to decision block 740 and determines if the comparison detects a logic transition. A logic transition can be detected by determining that the logic value of the symbol is different from the logic value of a prior symbol.

If no transition is detected, the deterministic jitter equalizer returns to block 710. However, if at decision block 740 the deterministic jitter equalizer determines that a transition occurred, the deterministic jitter equalizer proceeds to block 750 and adjusts the delay provided by the variable time delay to compensate for deterministic jitter effects attributable to the one or more transitions. The deterministic jitter equalizer proceeds back to block 710 and applies the adjusted time delay to the serial data stream.

Figure 8:
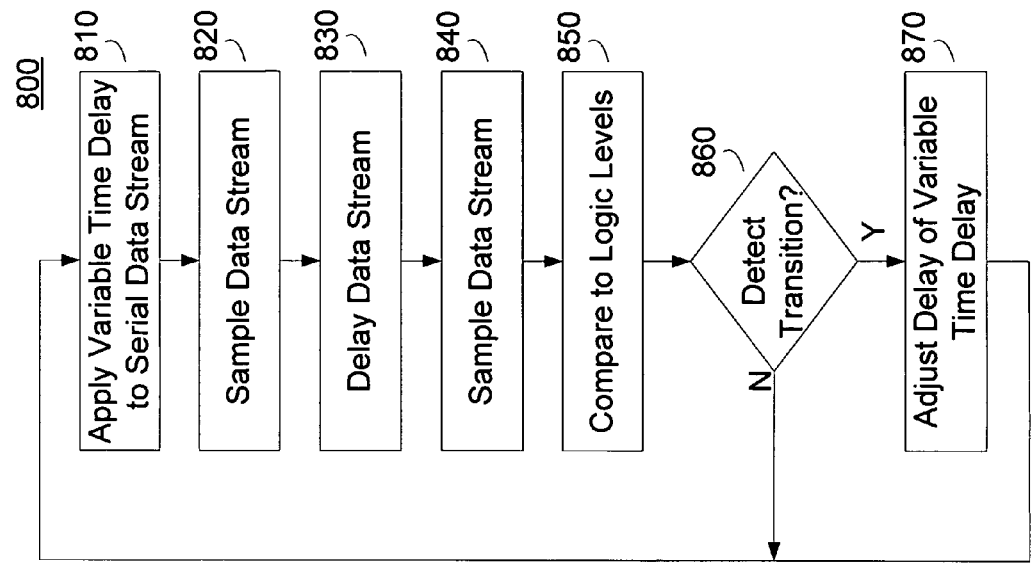
FIG. 8 is a simplified flowchart of an embodiment of a method of deterministic jitter equalization.

FIG. 8 is a flowchart of another method 800 of equalizing deterministic jitter. The method 800 can be performed, for example, by the deterministic jitter equalizers shown in FIGS. 2A-2B, 3A-3D, or 4.

The method 800 begins at block 810 where the deterministic jitter equalizer applies a variable time delay to a received serial data stream. The deterministic jitter equalizer proceeds to block 820 and samples the serial data stream, for example, by clocking the data stream into a flip-flop.

The deterministic jitter equalizer then proceeds to block 830 and applies a predetermined delay to the serial data stream. The predetermined delay can be, for example, a delay having a duration of substantially a symbol period. Alternatively, the predetermined delay can be an substantially an integer number of symbol periods.

After applying the predetermined delay, the deterministic jitter equalizer proceeds to block 840 and again samples the serial data stream. If the predetermined delay has a duration of greater than approximately one symbol duration, the symbol that is sampled will not be the same symbol sampled in the earlier sampling step.

The deterministic jitter equalizer proceeds to block 850 and compares the logic levels of the two samples. The deterministic jitter equalizer proceeds to block 860 to determine if a transition occurred. The deterministic jitter equalizer can detect a logic transition by performing a logical XOR of the two samples. If the two samples are the same logic levels, the XOR operation will indicate no transition occurred. However, if the two sampled logic levels are different, the XOR operation will indicate a logic transition.

If no logic transition is detected, the deterministic jitter equalizer proceeds back to block 810. If, at decision block 860, the deterministic jitter equalizer determines that a transition occurred, the deterministic jitter equalizer proceeds to block 870 and adjusts the delay of the variable time delay. The deterministic jitter equalizer then returns to block 810 and applies the adjusted time delay to the serial data stream.

Analysis of Data-Dependent Jitter

Data-dependent jitter (DDJ) occurs in any bandwidth-limited system. The finite bandwidth preserves the memory of previously transmitted symbols, affecting the current symbol. Our analysis relates the filter response to the DDJ characteristics. An ideal non-return-to-zero (NRZ) data sequence is expressed as $$s(t) = \sum_{-\infty}^{\infty} a_n p(t-nT) \quad \text{where} \quad p(t) = \begin{cases} 1 & 0 < t \leq T \\ 0 & t \leq 0, T < t \end{cases} \quad (1)$$

The coefficient, $a_n$, corresponds to the value of the nth bit. If $a_0$ is the current bit, the previous bits correspond to n<0. The term, p(t−nT), is the pulse function of the nth previous bit with period T. The pulse function has a duration of one bit period and s(t) does not suffer from DDJ.

A practical system has finite bandwidth and preserves memory of the data signal. The ideal signal in (1) is filtered with a general impulse response, h(t).

$$r(t) = h(t) \otimes s(t) = \sum_{-\infty}^{\infty} a_n h(t) \otimes p(t-nT) = \sum_{-\infty}^{0} a_n g(t-nT) \quad (2)$$

where $\hat{X}$ is the convolution operator. Causality limits the sum to the current symbol. The term, g(t), is the system response to an ideal pulse function and describes the memory of the system. This response is a design parameter and is often modeled as a first- or second-order transfer function in high-speed systems. The impact of filtering on an ideal sequence is demonstrated in FIG. 9 for a first- and second-order filter. Gibby and Smith formulated generalized filter responses that result in zero ISI or zero pulse-width distortion based on Nyquist's criteria. See R. A. Gibby and J. W. Smith, "Some Extensions of Nyquist's Telegraph Theory," *The Bell System Technical Journal*, vol. 44, No. 9, pp. 1487-1510, September 1965.

The properties of first- and second-order systems are different and are considered separately as examples of a general methodology. This methodology uses g(t) to calculate the transition time for a given sequence of previous symbols.

A. First-Order Response

Active device behavior in wideband circuits often exhibits first-order frequency roll-off. Hence, a first-order approximation estimates the response of system blocks (e.g. modulator or amplifier). Consider the following first-order impulse response:

$$h(t) = \frac{1}{\tau} e^{-t/\tau} u(t) \quad (3)$$

where u(t) is the unit step function and $\tau$ is the time constant of the response. Convolving the filter impulse response and the ideal input pulse yields the following response.

$$g(t) = \begin{cases} 0 & t < 0 \\ 1 - e^{-t/\tau} & 0 < t < T \\ e^{-(t-T)/\tau}(1 - e^{-T/\tau}) & T < t \end{cases} \quad (4)$$

Figure 9:
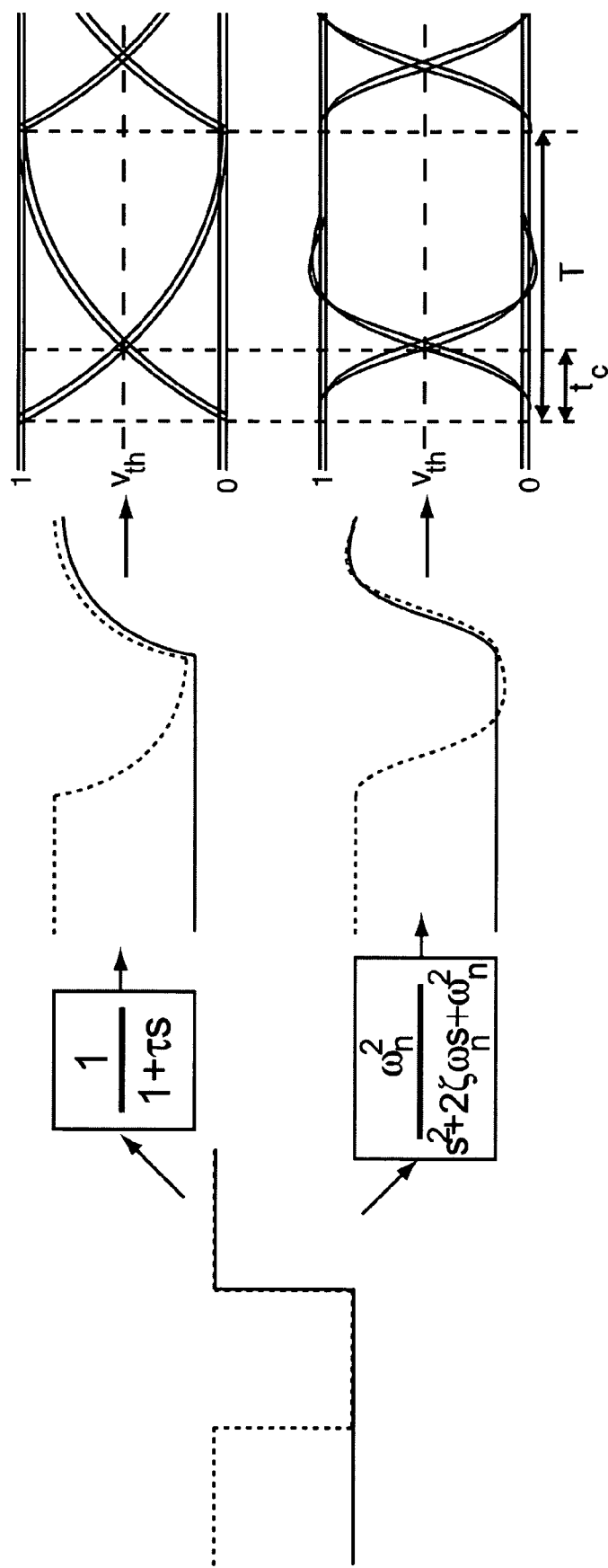
FIG. 9 is a simplified diagram illustrating the effects of filtering on a reference sequence.

At the CDR circuit, the symbols are regenerated by sampling the values at the maximum data eye opening. Accurate sampling depends on surpassing a voltage threshold, $v_{th}$, before the sampling time. The $v_{th}$ value is typically equidistant to the binary levels. The threshold crossing time, $t_c$, specifies the time at which the data signal reaches $v_{th}$ and is calculated implicitly for an arbitrary bit sequence in (2) with the response in (4). FIG. 9 illustrates the definition of $v_{th}$ and $t_c$ in a data eye.

$$v_{th} = r(t_c) = a_0(1 - e^{-t_c/\tau}) + \sum_{n=-\infty}^{-1} a_n e^{-t_c/\tau}[e^{(n+1)T/\tau} - e^{nT/\tau}] \quad (5)$$

The definition, $\alpha \equiv e^{-T/\tau}$, expands the bandwidth range around the bit rate. Since the bit rate is 1/T and the filter bandwidth is $1/(2\pi\tau)$, this parameter relates the bandwidth and the bit rate of the system. The range of a is illustrated with two cases. The first case is when the bandwidth equals the bit rate, where $\alpha = e^{-2\pi} = 0.0019$. Another practical case is when $t_c = T$. If $v_{th} = 0.5$, the bandwidth in this case is a mere 11% of the bit rate. Accordingly, $\alpha = e^{-ln(2)} = 0.5$.

Equation (5) can be re-written to express the threshold crossing time analytically.

$$t_c = \tau \cdot \ln\left[\sum_{n=-k}^{0}(a_n - a_{n-1})a^{-n}/(a_0 - v_{th})\right] \quad (6)$$

A threshold crossing only occurs for $a_0 \neq a_{-1}$. Since $\alpha<1$, $t_c$ has a decreasing memory of the nth bit. The number of prior bits that substantially impact $t_c$ depends exclusively on $\alpha$.

Equation (6) demonstrates a unique relationship between a sequence of bits and $t_c$ for $\alpha<\frac{1}{2}$. The unique mapping between the data sequence and $t_c$ for a first-order system is an interesting property of DDJ in serial data. However, the unique mapping does not hold necessarily for higher order systems and for this reason the situations are treated separately.

Figure 10:
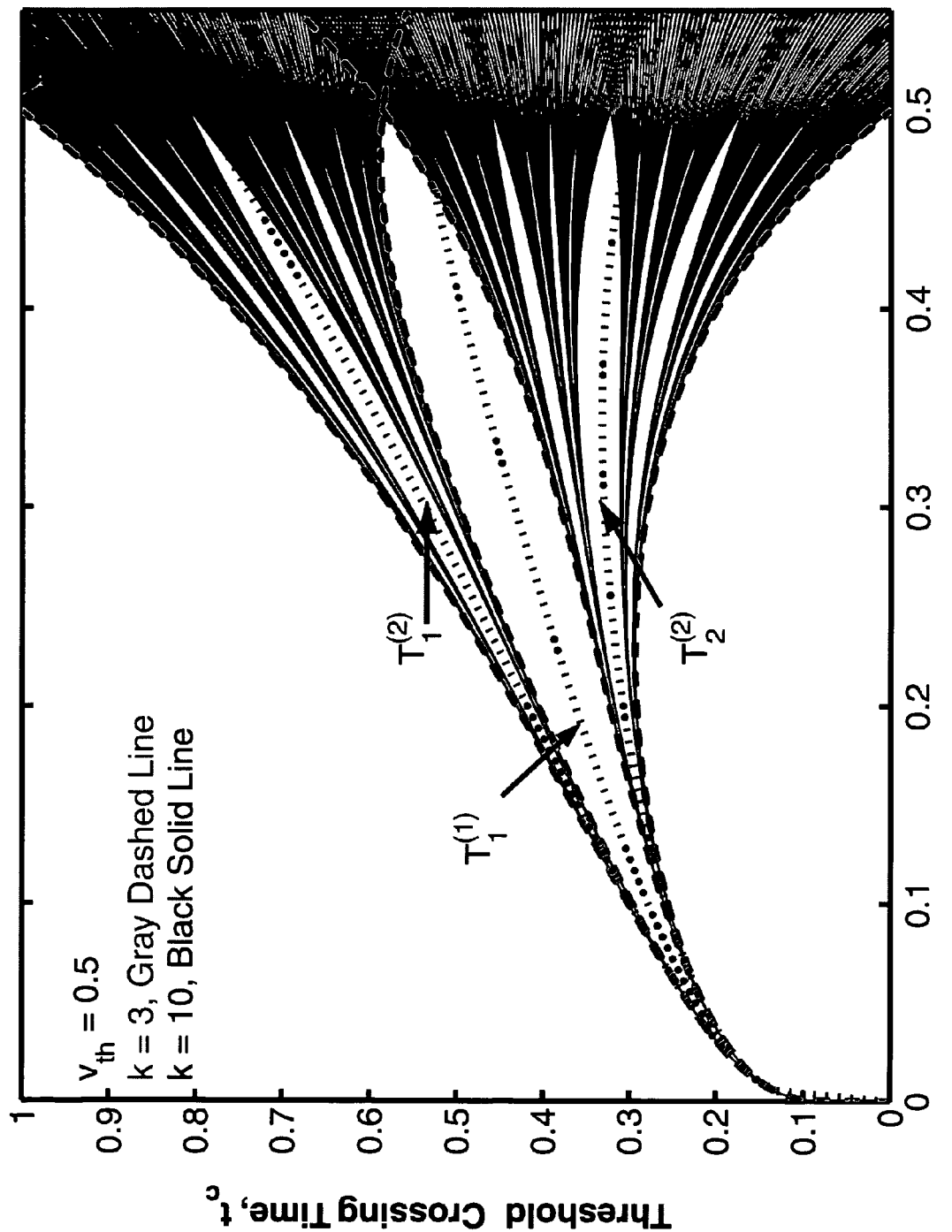
FIG. 10 is a graph of threshold crossing versus $\alpha$.

To discuss the impact of DDJ, we define the transition scale of the jitter. The scale, k, represents the depth of bits taken into account in (6). The transition scale limits the number of threshold crossing times to the number of bit sequences under consideration, $2^{k+1}$. By specifying a transition scale, we want to determine the time separation between different $t_c$ at a particular bandwidth. FIG. 10 demonstrates the variation of $t_c$ over the range of a for k=3 and k=10. Near the origin, the $t_c$ values converge and approach zero. As $\alpha$ increases, the $t_c$ values separate into fast and slow groups. Further increase in $\alpha$ results in each group separating into yet another layer of fast and slow groups. The bandwidth parameter, $\alpha$, determines the separation between $t_c$ values. Therefore, FIG. 10 indicates the relevant transition scale for a given bandwidth. Clearly, k=3 is a reasonable approximation to around $\alpha=0.2$. The $t_c$ values for this scale are identical for both the rising and falling edges if $v_{th}=0.5$. For example, the result of (6) for k=3 is $$t_{c,slowest} = \tau\ln\left[\frac{1}{v_{th}}\right] t_{c,slow} = \quad (7)$$

$$\tau\ln\left[\frac{1-\alpha^2}{v_{th}}\right] \; t_{c,fast} = \tau\ln\left[\frac{1-\alpha+\alpha^2}{v_{th}}\right] \; t_{c,fastest} = \tau\ln\left[\frac{1-\alpha}{v_{th}}\right].$$

Figure 11:
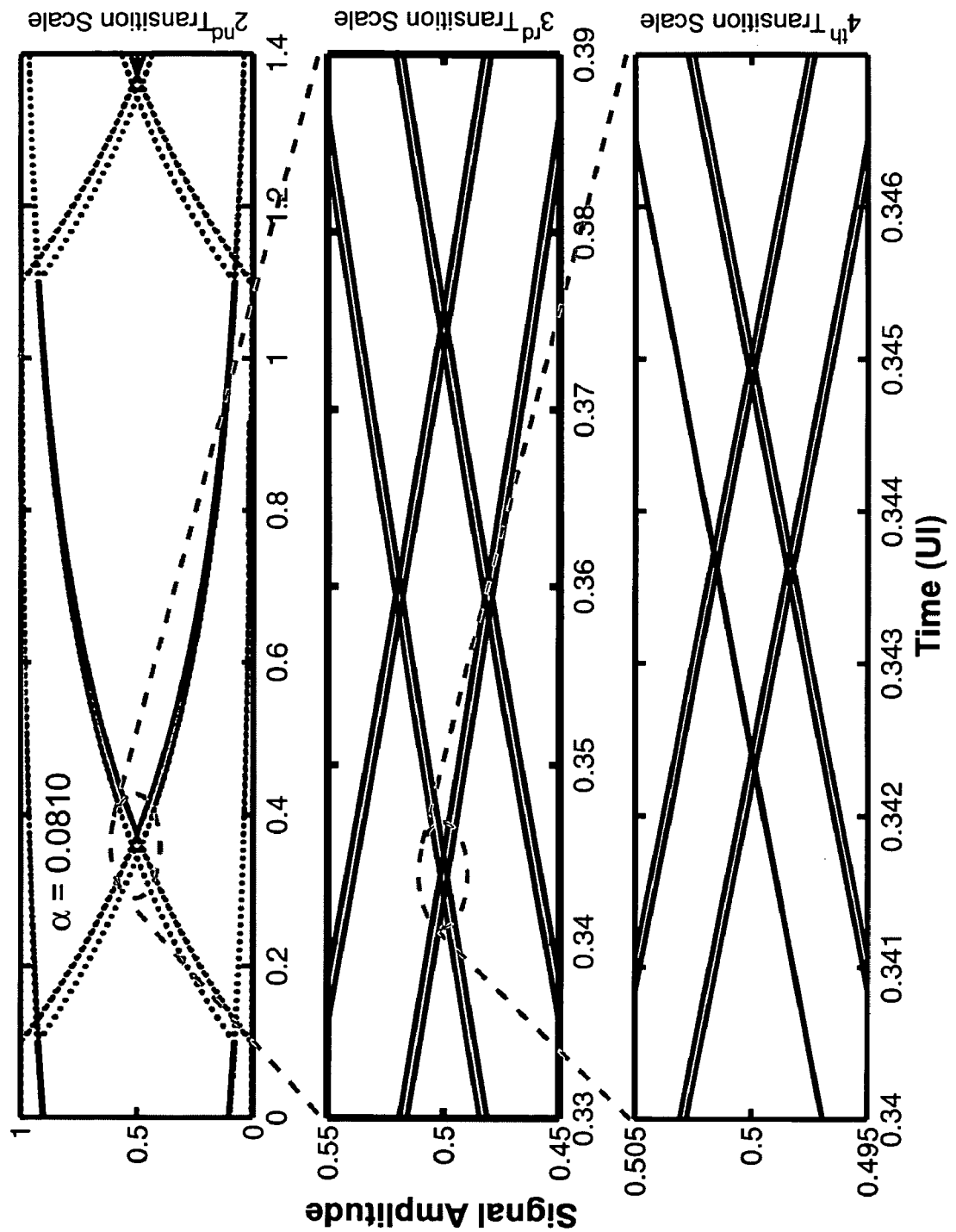
FIG. 11 are graphs of threshold crossing for various transition scales.

The behavior in FIG. 10 is self-similar and has the characteristics of a fractal geometry. When $\alpha$ is one-half, the self-similar behavior collapses. This agrees with the intuition regarding the range of possible $\alpha$ and the uniqueness argument. The bifurcation parameter is the kth transition scale. For larger k, each $t_c$ bifurcates into two values. FIG. 11 explains the bifurcation of $t_c$ in terms of the data eye. On the second transition scale, $t_c$ takes two values depending on the penultimate bit. If the scale is increased to three and the rising edge is magnified, four values of $t_c$ are apparent because of the impact of the third most recent bit. Finally, the fourth transition scale reveals that each of the trajectories on the third scale becomes two trajectories.

In summary, finite bandwidth of first-order systems introduces deviations to the threshold crossing time. The resulting jitter caused by the previous bits is related to the bandwidth of the system. Because the value of each previous bit is binary, the sum of the responses from the previous bits defines a unique threshold crossing time that bifurcates into two unique branches as the transition scale increases.

B. Higher-Order Responses

Higher-order responses do not generally have the unique threshold crossing time property of DDJ in the first-order system. Consider the all-pole, second-order response modeling the bandwidth-limitations of resonant circuits with natural frequency, $\omega_n$, and dampening factor, $\zeta$.

$$H(s) = \omega_n^2/(s^2 + 2\zeta\omega_n s + \omega_n^2) \quad (8)$$

The pole location determines the behavior of the response. If the poles are real, the response is overdamped. In this case, the behavior of the system is qualitatively similar to the first-order response. If the poles are complex, the response displays periodic components. This ringing alters the response of the filter to the bit sequences and requires refining the first-order results. The fastest second-order response might result from a string of zeros or ones followed by a transition and the slowest response might be associated with a "101" or "010" sequence as demonstrated in FIG. 9. This contradicts the first-order calculation and motivates investigating how the filter parameters affect the threshold crossing time.

Consider the Taylor series approximation of the step response. The first-order Taylor series is $$h(t) = \frac{e^{-\zeta\omega_n t}}{\sqrt{1-\zeta^2}}\sin\left(\sqrt{1-\zeta^2}\,\omega_n t + \phi\right) \approx h^{(0)}(t_{est}) + (t - t_{est})h^{(1)}(t_{est}) \quad (9)$$

where the superscript denotes the derivative. The exponential envelope of the step response in (9) estimates the threshold crossing time. Hence, $$t_{est} = -\frac{1}{\zeta\omega_n}\ln\left(v_{th}\sqrt{1-\zeta^2}\right).$$

The approximate response generalizes the first-order result in (4).

$$g(t) = \begin{cases} 0 & t < 0 \\ 1 - [h^{(0)}(t_{est}) + (t - t_{est})h^{(1)}(t_{est})] & 0 < t < T \\ h^{(0)}(t_{est} - T) - h^{(0)}(t_{est}) + (t - t_{est})[h^{(1)}(t_{est} - T) - h^{(1)}(t_{est})] & T < t \end{cases} \quad (10)$$

Now the threshold crossing time can be expressed analytically.

$$t_c = \left[v_{th} - a_0 + \sum_{n=-k}^{0} (a_n - a_{n-1})h^{(0)}(t_{est} - nT)\right] \bigg/ \left[-\sum_{n=-k}^{0} (a_n - a_{n-1})h^{(1)}(t_{est} - nT)\right] \quad (11)$$

Figure 12:
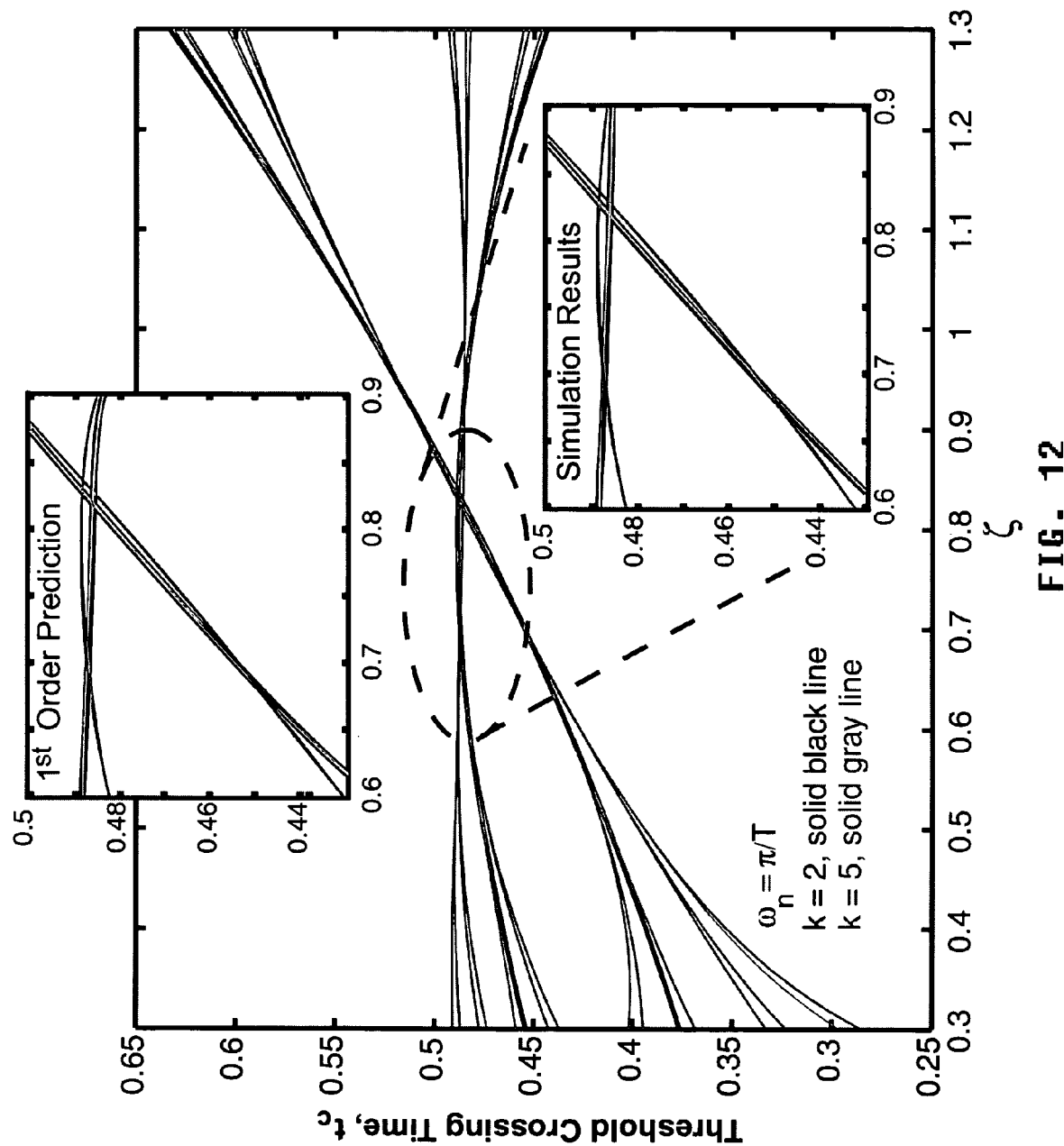
FIG. 12 is a graph of an empirical calculation for a second order system at a given frequency.

Equation (11) is reminiscent of (6) to stress the relationship between the possible bit sequences and $t_c$. Notably, (11) the slope of the response, $h^{(1)}(t)$, is in the denominator, indicating that slower responses increase DDJ. FIG. 12 illustrates an empirical calculation for the second-order system with respect to a range of $\zeta$ at a given $\omega_n$. For strong overdampening ($\zeta > 0.9$), the $t_c$ appear similar to a cross section of FIG. 10. However, as $\zeta$ decreases the $t_c$ converge and intersect. Two insets are provided. The first demonstrates the accuracy of the approximation in (11). The second is an expansion of the empirical calculation over the same range as the approximation. The inset graphs demonstrate that all $t_c$ do not intersect at the same value of $\zeta$. Reducing $\zeta$ results in $t_c$ that spread again into distinct values. However, the impact of the previous bits has changed. The fast and slow responses in the overdampened case, highlighted in black, are now reversed. The penultimate bit impacts the $t_c$ more strongly than the previous bit.

In general, (11) is provided as a means to study the DDJ of higher-order systems. As demonstrated for the second-order case, the properties of the DDJ change dramatically with the filter parameters. The threshold crossing time intersection implies a condition under which the DJ can be minimized. The performance of CDR circuits can be improved with filter parameters that take advantage of the intersection of the slow and fast response.

Duty-Cycle Distortion

Duty-cycle distortion (DCD) arises from responses with asymmetric rise and fall times. This asymmetry changes the pulse width of the symbol. Oftentimes, the rise and fall time asymmetry results from nonlinearity in an active device. According to this physical intuition, the model of DCD will involve two distinct time constants for rising and falling edges.

$$\tau_n = \tau + \gamma[a_n - a_{n-1}] = \begin{cases} \tau_{rise} & a_n - a_{n-1} = 1 \\ \tau_{fall} & a_n - a_{n-1} = -1 \end{cases} \quad (12)$$

where $\gamma$ is the deviation from the average time constant. Since this distortion is resulting from device behavior, the first-order DDJ model can be modified to study the impact of DCD. Equation (4) is re-written with a time constant that changes at the nth bit.

$$g_n(t) = \begin{cases} 0 & t < nT \\ 1 - e^{-[t-nT]/\tau_n} & nT < t < (n+1)T \\ e^{-[t-(n+1)T]/\tau_n} - e^{-[t-nT]/\tau_{n-1}} & (n+1)T < t \end{cases} \quad (13)$$

Note that the rising and falling edges do not intersect at $v_{th} = 0.5$. Following the approach for the first-order system, the threshold crossing time can be solved for implicitly.

$$a_0 - v_{th} = e^{\frac{-t\tau}{\tau^2 - \gamma^2}} \sum_{n=-k}^{0} e^{\frac{t\gamma \Delta a_n}{\tau^2 - \gamma^2}} e^{\frac{nT}{\tau - \gamma \Delta a_n}} \Delta a_n \quad (14)$$

where $\Delta a_n = a_n - a_{n-1}$. Unfortunately, the time dependence cannot be separated from the summation. One approach is to estimate the time dependence in the summation with a zeroth order approximation of $t_c$. For example, if the duty-cycle distortion was not present (i.e. $\gamma = 0$), $t_c \approx \tau \cdot \ln[V_{th}]$. With this assumption, reasonable for small $\gamma$, $$t_c = \frac{\tau^2 - \gamma^2}{\tau} \cdot \ln\left[\left(\sum_{n=-k}^{0} e^{\frac{-\tau\gamma \cdot \ln[v_{th}]\Delta a_n}{\tau^2 - \gamma^2}} e^{\frac{nT}{\tau + \gamma \Delta a_n}} \Delta a_n\right) \bigg/ (a_0 - v_{th})\right]. \quad (15)$$

Figure 13:
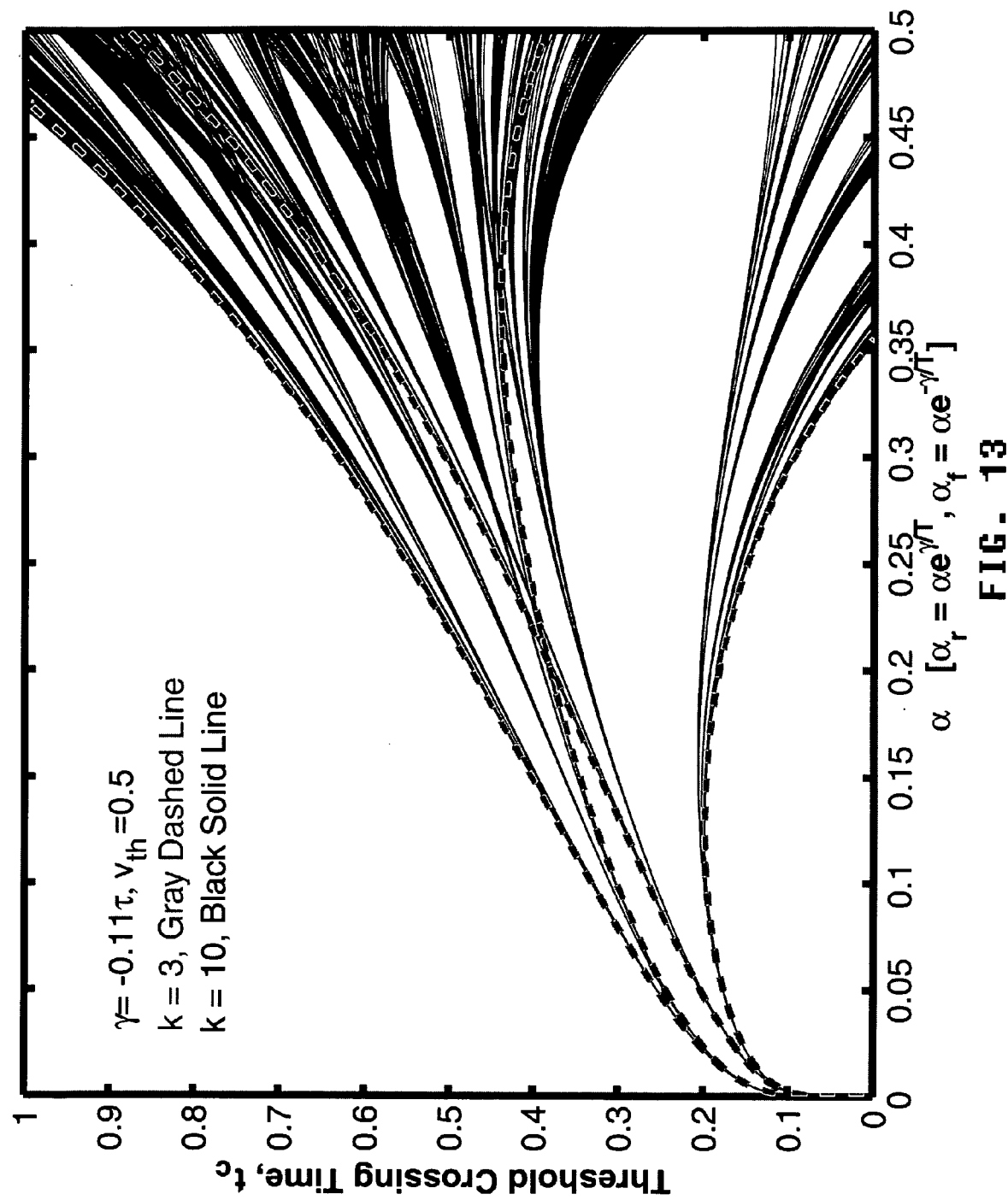
FIG. 13 is a graph of threshold crossing versus $\alpha$.

If $\gamma = 0$, this equation will simplify to (6). Equation (15) is graphed in FIG. 13 with comparable parameters to FIG. 10. Note that the bandwidth parameter, $\alpha$ is taken from the average time constant of the rising and falling edges. In this case, the rising edge is 25% faster than the falling edge. The features of the slow and fast groups are similar to the DDJ graph. However, the slow response trajectories are bunched together while the fast response trajectories spread rapidly. This seems counter-intuitive since the fast response is expected to produce less jitter from the discussion on DDJ. However, the fast response, in this case the rising edge, is influenced most strongly by the previous transition, a slow falling edge. Similarly, the fast rising edge introduces less jitter to the slow falling edge.

The non-linear response that causes DCD jitter cannot be filtered as simply as in the case of DDJ. Instead, a compensation scheme that recognizes the rising and falling edges and adjusts them appropriately can minimize DCD jitter.

Markov Chain Sampling of the Threshold Crossing Times

The features of DDJ and DCD are determined through the system response. Each data sequence is mapped to a particular threshold crossing time. The impact on symbol detection is modeled with a stochastic process that samples the $t_c$. The generation of NRZ data can be represented as a Markov chain. The binary values of NRZ data are assumed equiprobable and, therefore, the transition density is one-half. If the kth transition scale is considered, there exist $2^{k+1}$ different states of the system.

TABLE 1

States and the Threshold Crossing Times of a First-Order System

| State | Sequence | $t_c$ | Comment |
|---|---|---|---|
| 0 | 00 ... 000 | none | |
| 1 | 00 ... 001 | $\tau\ln\left[\frac{1}{1-v_{th}}\right]$ | slowest rising edge |
| 2 | 00 ... 010 | $\tau\ln\left[\frac{1-\alpha}{v_{th}}\right]$ | fastest falling edge |
| . | . | . | . |
| . | . | . | . |
| . | . | . | . |
| $2^{k+1} - 3$ | 11 ... 101 | $\tau\ln\left[\frac{1-\alpha}{1-v_{th}}\right]$ | fastest rising edge |
| $2^{k+1} - 2$ | 11 ... 110 | $\tau\ln\left[\frac{1}{v_{th}}\right]$ | slowest falling edge |
| $2^{k+1} - 1$ | 11 ... 111 | none | |

The state of a sequence of k+1 binary bits can be denoted by a decimal representation. $S_s$ is the state with decimal representation s. Half of these states have transitions at the $a_0$ bit. Table 1 illustrates the mapping between the states and the threshold crossing times. If the transition from state 1 to state 2 occurs, this corresponds to a jump from the slow rising edge to the fast falling edge. This jump harms the operation of threshold dependent circuits such as clock and data recovery circuits.

$$P_{i,j} \begin{bmatrix} 1/2 & 1/2 & 0 & 0 & \cdots & 0 & 0 \\ 0 & 0 & 1/2 & 1/2 & \cdots & 0 & 0 \\ \cdots & \cdots & \cdots & \cdots & \cdots & \cdots & \cdots \\ 1/2 & 1/2 & 0 & 0 & \cdots & 0 & 0 \\ 0 & 0 & 1/2 & 1/2 & \cdots & 0 & 0 \\ \cdots & \cdots & \cdots & \cdots & \cdots & \cdots & \cdots \\ 0 & 0 & 0 & 0 & \cdots & 1/2 & 1/2 \end{bmatrix} \quad (16)$$

The dynamics from state i to state j are expressed in the transition probability matrix in (16). For instance, $P_{3,7}$ is the probability of transition from 0011 to 0111 which is one-half.

A. Threshold Crossing Time Probability Density Function

The limiting probabilities of the transition probability matrix describe the probability mass function for $t_c$. Intuitively, we want to know how often each $t_c$ described in (6) is sampled. The limiting probabilities for the states, SS are calculated from the following conditions:

$$\pi_n = P_T \pi_m \quad \Sigma \pi_n = 1 \quad (17)$$

where $\pi_n$ the limiting probability of the nth state. For the transition probability matrix in (16), the first condition results in $2^{k+1}$ equations. The solution subject to the condition on the sum of the limiting probabilities is $$\pi_n = 2^{-k-1} \quad (18)$$

The probability mass function for $t_c$ is scaled from (18) by the transition density. Each state, and hence each $t_c$, is sampled equally over a long enough period of time.

Convolving the probability mass function with an appropriate sampling bandwidth generates a probability density function (PDF) for the transition times. Physically, this corresponds to the jitter histogram sampled on an oscilloscope. FIG. 10 can be expanded into the z-axis to reflect the probability of a particular $t_c$. For a given bandwidth, the peaks have equal height. This notion is the premise for empirical modeling of DDJ as a "double delta" function.

For DCD, the PDF will tend to feature a sharp and shallow peak. From the discussion on DCD, if the rising edge is 25% faster than the falling edge, the fast group will be related to the shallow peak and the slow group will be related to the sharp peak.

B. Conditioned Mean

The severity of DJ is reflected through the expectation of the threshold crossing times. Averaging all threshold crossing times washes away the qualitatively important properties of DJ. For instance, the difference between the fast and slow responses outlined in the first-order analysis might be desirable in modeling a jitter PDF.

More information is provided about the statistical properties of $t_c$ by conditioning the expectation. We consider the mth scale conditioned mean when the m most previous bits comprise the conditioning state. The conditioned mean is denoted as $$T_i^{(m)} = E[t_c | a_{-1} a_{-2}, \ldots, a_{-m}] \quad (19)$$

$T_i^{(m)}$ is the expectation of the transition time for i possible conditions on the previous bits where i ranges from 1 to $2^m$. It is assumed under these conditions that $a_0 \neq a_{-1}$.

The first scale conditioned mean implies conditioning only on the previous bit. By definition the previous bit differs from the current bit and this is the expectation of any $t_c$. Furthermore, the second scale conditioned means implies conditioning on two previous bits. In this case, four sets of $t_c$ are possible: the rising and falling transitions of $a_{-1} = a_{-2}$ and $a_{-1} \neq a_{-2}$. Assuming $v_{th} = 0.5$, the rising and falling edge situations are combined.

$$T_1^{(2)} = E[t_c | a_{-1} = a_{-2}] \quad T_2^{(2)} = E[t_c | a_{-1} \neq a_{-2}] \quad (20)$$

This second scale conditioned mean situation requires the use of $k \geq 3$ because k must be greater than m+1. If k=3, there are eight possible transitions: $t_1$, $t_6$, $t_9$, $t_{14} \in S_{c|a-1} = a_{-2}$ and $t_2$, $t_5$, $t_{10}$, $t_{13} \in S_{c|a-1} \neq a_{-2}$ where $t_i$ is the $t_c$ of the ith state. The expectation is calculated from the sum over the conditional probabilities and $t_c$. Equation (18) proves that the conditional probabilities of all terms are identical.

$$E[t_c | a_{-1} = a_{-2}] = \frac{\tau}{2^2} \ln \left[ \frac{(1-\alpha^2)^2}{(v_{th})^2 (1-v_{th})^2} \right] \quad (21)$$

$$E[t_c | a_{-1} \neq a_{-2}] = \frac{\tau}{2^2} \ln \left[ \frac{(1-\alpha)^2 (1-\alpha+\alpha^2)^2}{(v_{th})^2 (1-v_{th})^2} \right]$$

These means are the expected slow and fast threshold crossing times. The mean difference is $$\Delta T^{(2)} = T_1^{(2)} - T_2^{(2)} = \frac{\tau}{2} \ln \left[ \frac{1+\alpha}{1-\alpha+\alpha^2} \right]. \quad (22)$$

This mean difference provides a quantitative description for the double delta function spread of empirical DDJ models. This calculation is compared with the threshold crossing map in FIG. 10.

The first scale conditioned mean averages any possible transition and is useful for normalizing the stochastic progression of $t_c$. The first scale conditioned mean is the average of the second scale conditioned mean terms. For the third transition scale case in (21), $$T^{(1)} = \frac{\tau}{2^2} \ln \left[ \frac{(1-\alpha)(1-\alpha+\alpha^2)(1-\alpha^2)}{(v_s)^2 (1-v_s)^2} \right] \quad (23)$$

This value is also graphed in FIG. 10. The conditioned mean notation is useful for calculating the peaks of the probability density function developed in the previous section.

C. Cycle-to-Cycle Deterministic Jitter

In many broadband applications, cycle-to-cycle jitter disturbs the circuit operation. Instantaneous clock and data recovery techniques leverage jitter rejection for improved acquisition time and are susceptible to cycle-to-cycle jitter. The root-mean-square (rms) cycle-to-cycle jitter is the variance of the difference between adjacent threshold crossing times.

$$\Delta T_{cc,rms} = \sqrt{Var(t_j - t_i)} = \sqrt{E[(t_j - t_i)^2] - E[(t_j - t_i)]^2} \quad (24)$$

The expectation of the difference in the threshold crossing times is zero and (24) can be conditioned on the probability of a particular $t_c$ and the number of symbol periods that occur before the next transition.

$$E[t_{ij}^2] = \sum_{S_s} E[t_{ij}^2 \mid t_i] \Pr\{t_i\} = \sum_{S_s} \sum_{n \geq 0} E[t_{ij}^2 \mid t_i, N=n] \Pr\{t_i\} \Pr\{N=n\} \quad (25)$$

where $t_{ij} = t_j - t_i$ is the threshold crossing time difference. N is a random variable representing the number of periods between transitions and has probability of one-half after one symbol period, probability of one-fourth after two periods, and this pattern continues indefinitely. For k=2, there are four possible states with threshold crossing times.

$$E[t_{ij}^2] = \frac{1}{4} \sum_{n=1}^{\infty} \frac{1}{2^n} \sum_i E[t_{ij}^2 \mid t_i, N=n] \quad (26)$$

Simplifying (26) with our expressions for the threshold crossing times gives $$E[t_{ij}^2] = \frac{\tau^2}{4} \left[ \left( \ln\left[ \frac{(1-\alpha)(1-v_s)}{v_s} \right] \right)^2 + \left( \ln\left[ \frac{(1-\alpha)(v_s)}{1-v_s} \right] \right)^2 + \left( \ln\left[ \frac{(1-v_s)}{v_s} \right] \right)^2 \right]. \quad (27)$$

The standard deviation of the cycle-to-cycle jitter is the square root of (27). Equation (27) is minimized for $v_{th}=0.5$.

$$\Delta T_{cc,\text{rms}} = \sqrt{E[t_{ij}^2]} = \frac{\tau\sqrt{2}}{2} \ln(1-\alpha) \quad (28)$$

This agrees with the rms intuition that $t_c$ deviates by $\tau\ln(1-\alpha)$ or zero with equal probability.

Alternatively, applications exist in which the cycle-to-cycle jitter is referenced only to the rising edges as opposed to both edges. For k=2, there are two possible rising edges. Since it is impossible to map into another rising edge after one symbol period, all possible paths involve at least two periods. If the combinations of rising edges are examined, the following expression can be reached for the cycle to cycle jitter of a rising edge sensitive circuit.

$$\Delta T_{cc,\text{rms}} = \sqrt{E[t_{ij}^2]} = \tau \sqrt{\frac{7}{16}} \ln(1-\alpha) \quad (29)$$

While this jitter is roughly the same as the cycle-to-cycle jitter for the rising and falling edge, it is insensitive to the sampling voltage.

Figure 14:
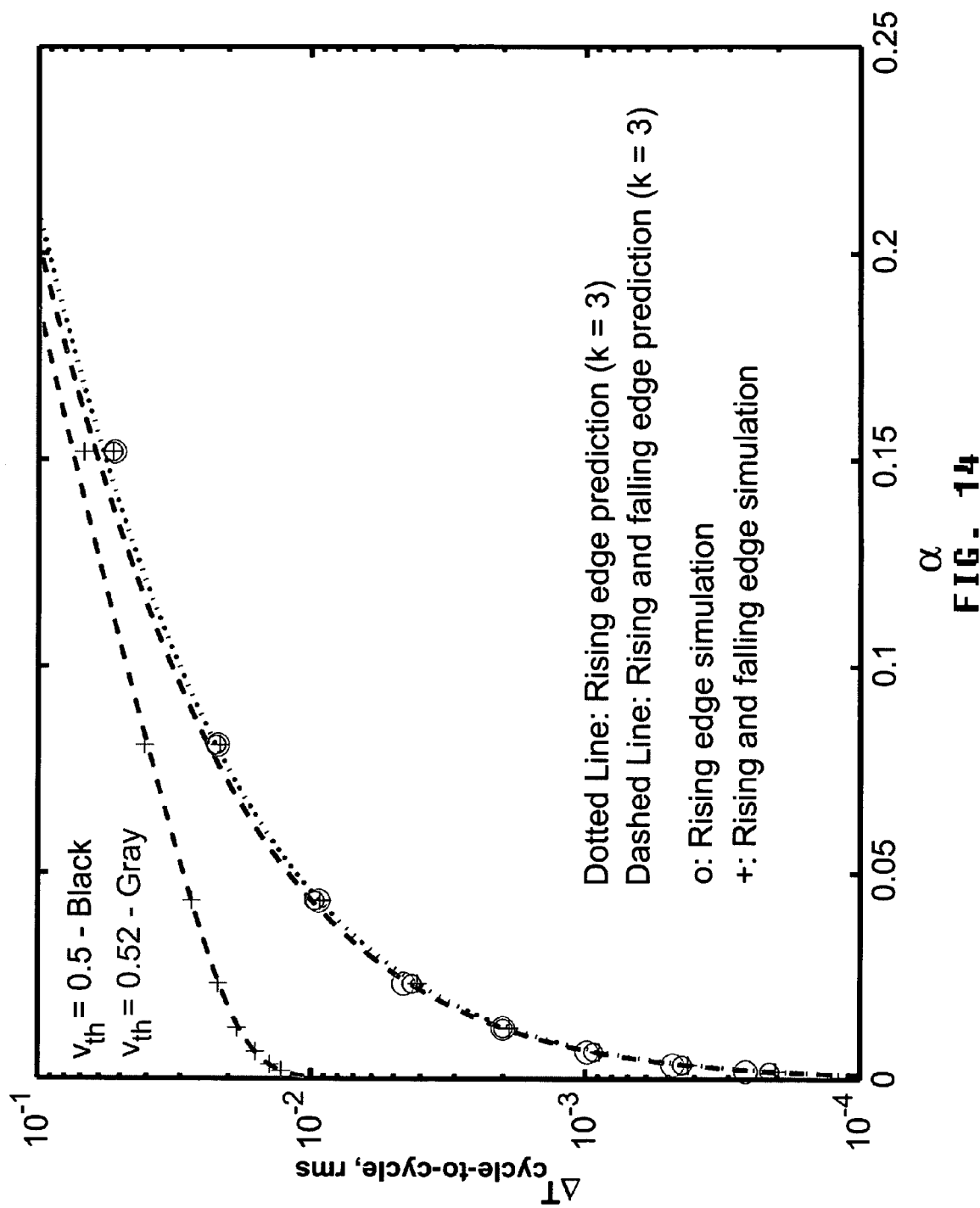
FIG. 14 is a graph comparing the standard deviation of cycle-to cycle jitter for two situations.

Comparisons between the standard deviation of the cycle-to-cycle jitter for these two situations and simulations are provided in FIG. 14. The simulation is performed using a Simulink model for a PRBS generator and a first-order LTI system. The data is filtered and the statistics of the time between threshold crossing times are calculated. The predictions match the simulations over much of the bandwidth range. The predictions show that the cycle-to-cycle jitter is exceedingly small at large bandwidth but rises sharply as the bandwidth decreases. Furthermore, a small voltage threshold variation results in a dramatic increase in the jitter. The advantage of circuits sensitive to only the rising edge is clearly the robustness to sampling voltage variation.

Deterministic Jitter Impairment on Clock Recovery

In conventional timing recovery, a local oscillator is synchronized to the edges of the received data in a phase locked loop (PLL). Timing uncertainty of the data translates to phase noise of the local voltage-controlled oscillator (VCO). The jitter process described in the previous sections is cast as a power spectral density (PSD) that disturbs the oscillator phase. While the operation of a PLL is non-linear, the response of the PLL to small perturbations is essentially linear. Therefore, the VCO phase noise can be related directly to the PSD of the DJ.

The threshold crossing times can be considered alternately as threshold crossing phases.

$$\phi_i = 2\pi t_i / T \quad (30)$$

The PSD of the VCO, $S_{VCO}(f)$, is related linearly to the input PSD of the data, $S_\phi(f)$, through a linear transfer function that relates the parameters of the phase locked loop circuit.

$$S_{vco}(f) = \left| \frac{K_v H_{loop}(f)}{1 + K_v H_{loop}(f)} \right|^2 S_\phi(f) \quad (31)$$

$K_v$, with units of [Hz/V], is the gain of the VCO and $H_{loop}(f)$ is the loop filter response. Others have optimized the loop filter parameters for jitter on the basis of the inherent oscillator noise and jitter transfer function. This treatment isolates the behavior of $S_\phi(f)$.

The non-linear characteristics of the PLL arise because of phase detection. To linearize the loop dynamics, the non-linearity can taken into account in the calculation of $S_\phi(f)$. Phase detector circuits use different techniques to generate phase error between the data and the VCO. Two detection methods are particularly important: a) both edges or b) only the rising edges are used to extract the phase information.

The jitter PSD is the Fourier transform of the autocovariance of the phase of the data transitions, $S_\phi(f) = \Im\{R_\phi(nT)\}$ where the autocovariance of the phase is $R_\phi(nT)$. For ergodic processes the time average and the ensemble average of the phase autocovariance are interchangeable. In this case, the piecewise representation of the autocovariance function can be transformed to the frequency domain to find the PSD.

$$S_\phi(f) = \sum_{n=-\infty}^{\infty} R_\phi(nT) e^{-j2\pi f nT} \quad (32)$$

$R_\phi(0)$ is the expected power of the jitter. Notably, if only $R_\phi(0)$ is significant, then the DJ is characterized as a white noise floor.

$$S_\phi(f) = R_\phi(0) \quad (33)$$

The general form of the phase autocovariance is $$R_\phi(nT) = E[(\phi_j - m_\phi)(\phi_i - m_\phi)]. \quad (34)$$

where $\phi_j$ and $\phi_i$ are phases that occur n bits apart. The mean of the phase, $m_\phi$, has been calculated in (23). The transition probability matrix in (16) is particularly useful for calculating the auto covariance.

$$R_\phi(nT) = E[E[(\phi_j - m_\phi)(\phi_i - m_\phi) | \phi_i]] = \sum_{i \in S_s} P(\phi_i) \sum_{j \in S_s} (\phi_j - m_\phi)(\phi_i - m_\phi) P_{i,j}^n \quad (35)$$

Equation (34) has been conditioned on the initial state, $\phi_i$. After n periods, the probability of each state is given by the nth power of the $P_{ij}$. However, any phase is equiprobable after n exceeds the transition scale. Therefore, after k bits no covariance exists for the phases associated with Markov chain generated data and the autocovariance is zero.

$$R(nT)=0 \quad n \geq 2k \quad (36)$$

Now consider the different cases for $S_\phi(f)$.

A. Rising and Falling Edges

To develop intuition about the autocovariance of DDJ in a first-order system, we calculate the autocovariance terms individually. For the second transition scale, $R_\phi(0)$ is $$R_\phi(0) = E[E[(\phi - m_\phi)^2] | \phi] = \quad (37)$$
$$\frac{1}{8}[(\phi_1 - m_\phi)^2 + (\phi_2 - m_\phi)^2 + (\phi_5 - m_\phi)^2 + (\phi_6 - m_\phi)^2]$$

where $m_\phi 2\pi T^{(1)}/T$ and is calculated from the expectation in (23). Simplifying the expression, $$R_\phi(0) = \left(\frac{\pi\tau}{2T}\right)^2 \left[\left(\ln\left[\frac{(1-v_{th})(1-\alpha)}{v_{th}}\right]\right)^2 + \left(\ln\left[\frac{v_{th}(1-\alpha)}{1-v_{th}}\right]\right)^2\right] \quad (38)$$

The role of $v_{th}$ stands out. Equation (38) is minimized for $v_{th}=0.5$. Deviations from this optimal point increase the $R_\phi(0)$. Additionally, reducing the bandwidth dramatically increases this term.

If the autocovariance for one period, $R_\phi(0)$, is calculated for k=2, $R_\phi(T)$ is zero. Furthermore, higher order terms are also zero because of (36). This is not generally true. If k=3, $R_\phi(T)$ is $$R_\phi(T) = \frac{1}{2}\left(\frac{\pi\tau}{2T}\right)^2 \left[-14\left(\ln\frac{(v_{th})}{1-v_{th}}\right)^2 + \ln(1-\alpha)\ln(1+\alpha) + \ln(1-\alpha+\alpha^2)\ln\left(\frac{1-\alpha+\alpha^2}{1-\alpha^2}\right)\right] \quad (39)$$

Closer examination reveals that (39) is negative for all a. However, higher transition scales are useful only with extremely limited bandwidth.

Figure 15:
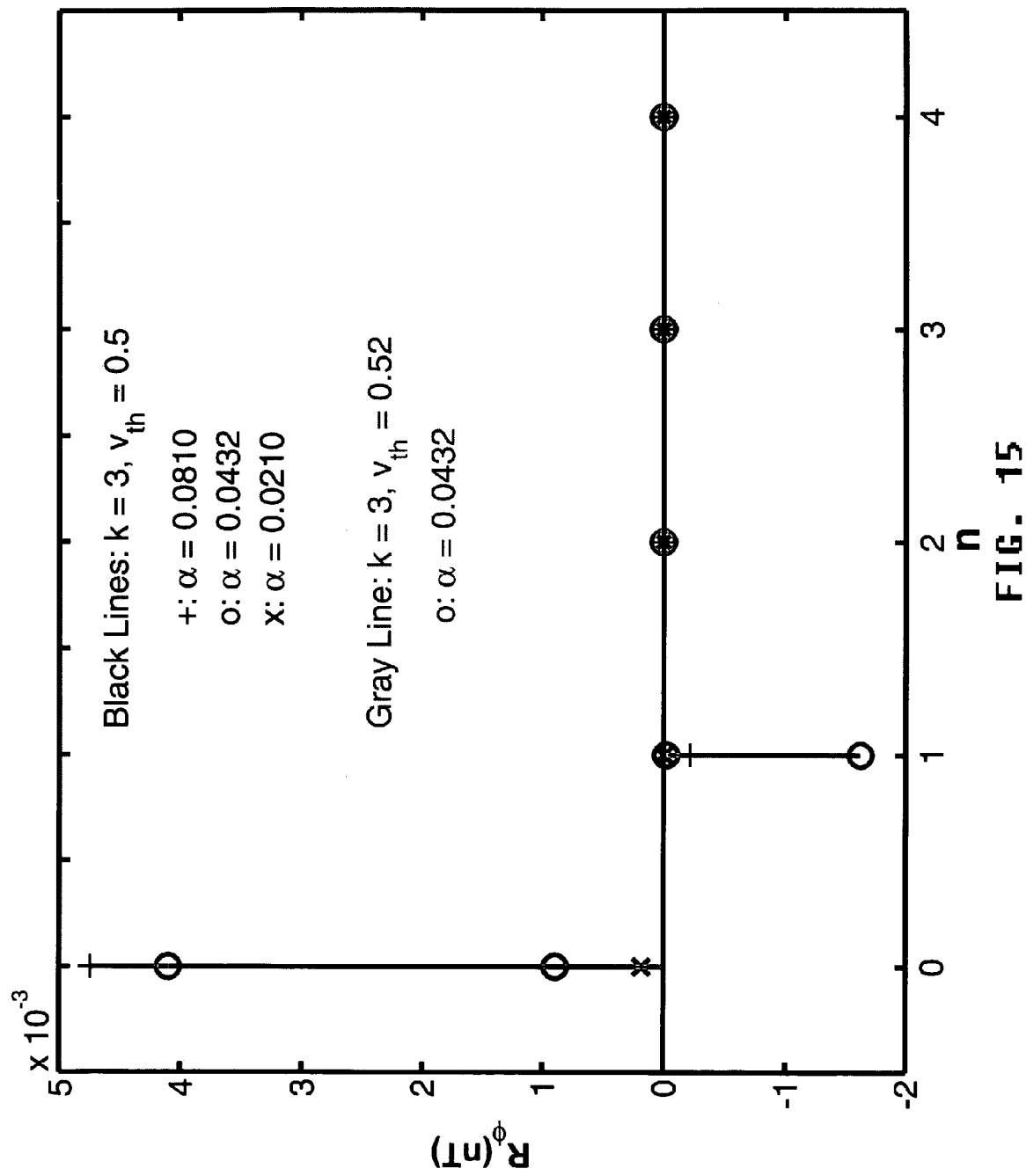
FIG. 15 is a graph of autocovariance.

FIG. 15 examines the autocovariance with k=3. The $R_\phi(nT)$ terms are plotted with respect to bandwidth in black and voltage threshold in gray. The change in $R_\phi(0)$ is evident and $R_\phi(T)$ demonstrates a small negative value as the bandwidth drops. Therefore, the PSD of DDJ, in this case, is primarily a white noise. For voltage threshold variations, $R_\phi(0)$ and $R_\phi(T)$ increase dramatically, implying that rising and falling edge-sensitive phase detection circuits are particularly susceptible to threshold variation. To verify the result, Simulink simulated the phase autocovariance over ten thousand bits.

Figure 16:
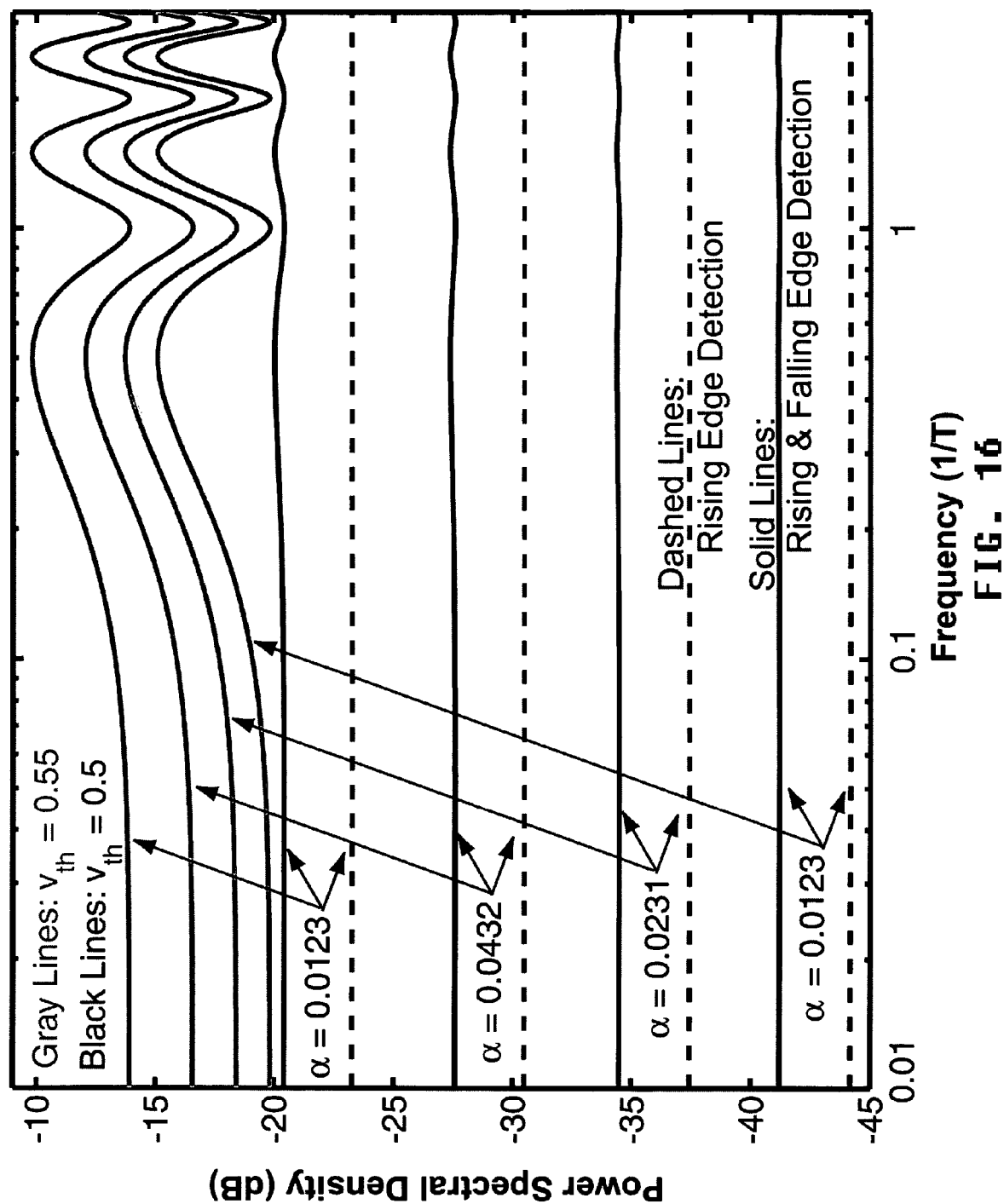
FIG. 16 is a graph of power spectral density of data dependent jitter.

The PSD of the DDJ is plotted in FIG. 16. The noise floor rises with reduced bandwidth. For each 10% the bandwidth reduces, the noise floor increases by 7 dB. Furthermore, the noise increases drastically for different voltage thresholds. A 10% variation in the voltage threshold translates into 10 dB of degradation in the noise.

B. Rising Edges Only

The $R_\phi(0)$ can be expressed for k=2 as $$R_\phi(0) = E[E[(\phi - m_\phi)^2] | \phi] = \frac{1}{2}[(\phi_1 - m_\phi)^2 + (\phi_5 - m_\phi)^2]. \quad (40)$$

Note that $m_\phi$ is different in this case. Simplifying the expression, $$R_\phi(0) = \left(\frac{\pi\tau}{T}\right)^2 [\ln(1-\alpha)]^2. \quad (41)$$

$R_\phi(0)$ is still strictly positive. This result is a factor of two from (37) when $v_{th}=0.5$. $R_\phi(T)$ is identically zero since it is impossible to go from rising edge to rising edge in one bit period.

$$R_\phi(T)=0 \quad (42)$$

For k=2, $R_\phi(2T)$ is also zero.

$$R_\phi(2T) = \frac{1}{8}[(\phi_1 - m_\phi)(\phi_5 - m_\phi) + (\phi_5 - m_\phi)^2] = 0 \quad (43)$$

The higher-lag autocovariance terms are zero from (36). Clearly, $R_\phi(nT)$ is not dependent on the threshold voltage. Consequently, there is an advantage to implementing phase detectors that are sensitive only to rising (or falling) edges. A primary difference is that $R_\phi(0)$ is one-half of the value for the rising and falling edge detection. While this implies that the noise floor will be 3 dB lower, the PLL dynamics might compensate for the lower phase detection gain and amplify the noise floor to the level of the rising and falling edge detection. The PSD for rising edge sensitive phase detection is plotted in FIG. 17 in dashed lines. The noise is perfectly white over the entire range and increases, as expected, with lower bandwidth. The noise is 3 dB lower that the rising and falling edge case.

C. Duty-Cycle Distortion Jitter

Figure 17:
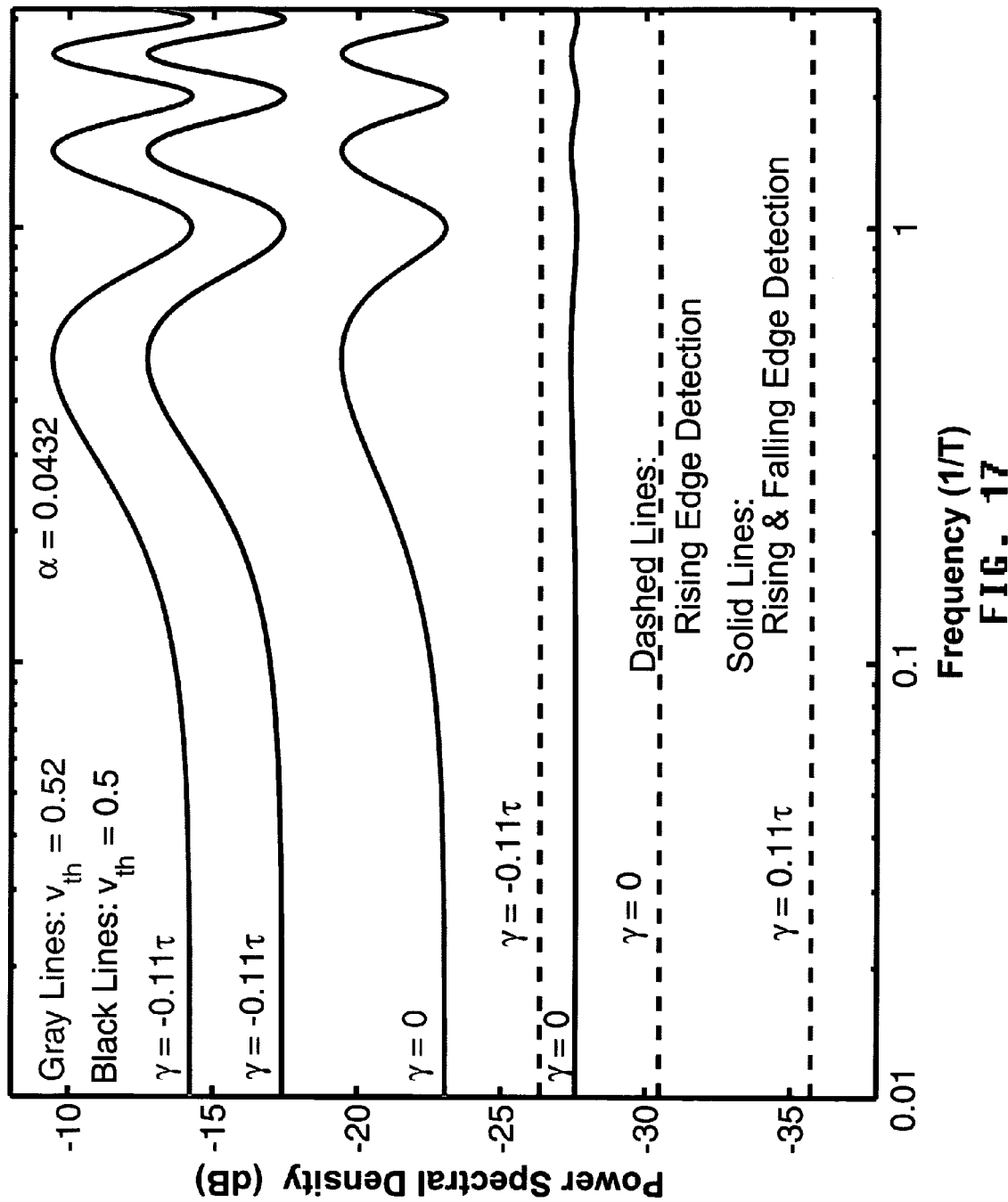
FIG. 17 is a graph of power spectral density of duty cycle dependent jitter.

Finally, the PSD of DCD jitter is presented in FIG. 17. The threshold crossing times for DCD have been substituted into the autocovariance terms calculated in the previous sections and the PSD is graphed. The solid lines are for rising edge and falling edge detection for a bandwidth of one-half of the bit rate and a rising edge that is 25% faster than the falling edge. For comparison, the DDJ case is plotted as γ=0. The asymmetric edges increase the noise floor of the PSD by about 10 dB. Furthermore, the noise is colored even in the case that $v_{th}=0.5$. The dashed lines are for rising edge detection. In this case, the rising edge is 25% faster than the falling edge for γ=-0.11τ and the falling edge is 25% faster than the rising edge for γ=0.11τ. Interestingly, the choice of which edge is detected results in a large change in the noise floor of the jitter.

This implies that in circuits that are susceptible to DCD the phase detection should be performed with the slower edge.

Methods, apparatus, and systems for deterministic jitter equalization are disclosed. The jitter equalizer can determine if one or more transitions occurred during previously received symbols and compensate for deterministic jitter based on the determination. The deterministic jitter equalizer can compensate for the deterministic jitter by varying a delay positioned in series with serial data. In other embodiments, the deterministic jitter equalizer can vary a threshold voltage used to determine a logic state of received data.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A method of equalizing deterministic jitter, the method comprising:
    determining a logic value of a recovered symbol;
    determining a logic value of at least one prior symbol received prior to the recovered symbol;
    comparing the logic value of the recovered symbol to the logic value of the at least one prior symbol, wherein comparing the logic value comprises performing a logical XOR of the recovered symbol with one of the at least one prior symbol; and
    adjusting a variable time delay positioned in a serial communications data path based in part on a result of the comparison.

2. The method of claim 1, wherein determining the logic value of the recovered symbol comprises determining one of a binary logic value for the symbol of interest.

3. The method of claim 1, wherein determining the logic value of the recovered symbol of interest comprises determining one of an M-ary logic value for the recovered symbol.

4. The method of claim 1, wherein the at least one prior symbol comprises a symbol received immediately preceding the recovered symbol.

5. The method of claim 1, wherein the at least one prior symbol comprises a symbol received at least one symbol period prior to the recovered symbol.

6. The method of claim 1, wherein comparing the logic value comprises performing the logical XOR of the recovered symbol with a symbol received immediately preceding the recovered symbol.

7. The method of claim 1, wherein adjusting the variable time delay comprises selecting one of a plurality of predetermined time delays based on the result of the comparison.

8. The method of claim 1, wherein adjusting the variable time delay comprises increasing a delay of the variable time delay if the logic value of the recovered symbol is distinct from the logic value of any of the at least one prior symbol.

9. The method of claim 1, wherein adjusting the variable time delay comprises decreasing a delay of the variable time delay if the logic value of the recovered symbol is distinct from the logic value of any of the at least one prior symbol.

10. The method of claim 1, wherein adjusting the variable time delay comprises maintaining a time delay of the variable time delay if the logic value of the recovered symbol and the logic value of the at least one prior symbol are the same.

11. A method of equalizing deterministic jitter, the method comprising:
    sampling a serial data stream at a first time instant;
    sampling the serial data stream a predetermined time delay following the first time instant, wherein the predetermined time delay comprises substantially an integer multiple of one symbol period;
    comparing a logic level of the serial data stream at the first time instant to a logic level of the serial data stream at the predetermined time delay following the first time instant; and
    adjusting a variable time delay of the serial data stream based in part on a result of the comparison.

12. The method of claim 11, wherein the predetermined time delay comprises substantially one symbol period.

13. A method of equalizing deterministic jitter, the method comprising:
    receiving a serial data stream configured to operate at a symbol rate greater than approximately 6 Giga-symbols per second;
    determining if one or more logic transitions occurred within a plurality of previously recovered symbols from the serial data stream; and
    varying a time delay applied to the serial data stream based in part on the one or more logic transitions.

14. The method of claim 13, further comprising:
    delaying the serial data stream by a variable time delay to generate a delayed serial data stream; and
    recovering symbols from the delayed serial data stream.

15. The method of claim 13, wherein receiving the serial data stream comprises receiving the serial data stream over a bandwidth limited channel having a bandwidth less than the symbol rate.

16. The method of claim 13, wherein receiving the serial data stream comprises receiving the serial data stream over a bandwidth limited channel having a bandwidth less than approximately 70 % of the symbol rate.

17. The method of claim 13, wherein receiving the serial data stream comprises receiving the serial data stream over an electrically conductive transmission line.

18. The method of claim 13, wherein receiving the serial data stream comprises receiving the serial data stream over an optical link.

19. The method of claim 13, wherein the serial data stream is configured to operate at a symbol rate equal to or greater than approximately 10 Giga-symbols per second.

20. An apparatus for equalizing deterministic jitter, the apparatus comprising:
    a variable time delay module configured to receive a serial data stream and output a delayed serial data stream;
    a comparator module configured to compare a symbol from the delayed serial data stream to one or more previously received symbols and generate a comparator output; and
    a control module configured to control a delay provided by the variable time delay module based at least in part on the comparator output, wherein the control module comprises a signal summer configured to sum a nominal control voltage with the comparator output.

21. The apparatus of claim 20, wherein the variable time delay module comprises a discretely variable delay module.

22. The apparatus of claim 20, wherein the variable time delay module comprises:
   a plurality of delay paths, each delay path corresponding to a distinct time delay; and
   a multiplexer having a plurality of inputs, each of the plurality of inputs coupled to one of the plurality of delay paths, and configured to selectively output a data stream corresponding to one of the plurality of delay paths.

23. The apparatus of claim 20, wherein the variable time delay module comprises a continuously variable delay module.

24. The apparatus of claim 20, wherein the comparator module comprises:
   a delay module having an input and an output; and
   a logical XOR module having a first input coupled to the input of the delay module and a second input coupled to the output of the delay module.

25. An apparatus for equalizing deterministic jitter, the apparatus comprising:
   a variable time delay module configured to receive a serial data stream and output a delayed serial data stream;
   a comparator module configured to compare a symbol from the delayed serial data stream to one or more previously received symbols and generate a comparator output; and
   a control module configured to control a delay provided by the variable time delay module based at least in part on the comparator output, wherein the control module comprises a multiplier configured to scale a nominal control voltage based on the comparator output.

* * * * *